United States Patent
Nagulu et al.

(10) Patent No.: US 11,205,826 B2
(45) Date of Patent: Dec. 21, 2021

(54) CIRCUITS AND METHODS FOR CIRCULATORS INCLUDING A PLURALITY OF CANCELLATION PATHS

(71) Applicant: The Trustees of Columbia University in the City of New York, New York, NY (US)

(72) Inventors: Aravind Nagulu, New York, NY (US); Harish Krishnaswamy, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 17/255,679

(22) PCT Filed: Jun. 11, 2019

(86) PCT No.: PCT/US2019/036628
§ 371 (c)(1),
(2) Date: Dec. 23, 2020

(87) PCT Pub. No.: WO2020/036669
PCT Pub. Date: Feb. 20, 2020

(65) Prior Publication Data
US 2021/0242552 A1    Aug. 5, 2021

Related U.S. Application Data

(60) Provisional application No. 62/683,541, filed on Jun. 11, 2018.

(51) Int. Cl.
*H01P 1/397*   (2006.01)
*H03D 7/14*    (2006.01)
*H01P 1/38*    (2006.01)

(52) U.S. Cl.
CPC ............... *H01P 1/397* (2013.01); *H01P 1/38* (2013.01); *H03D 7/1458* (2013.01); *H03D 7/1466* (2013.01)

(58) Field of Classification Search
CPC ...... H01P 1/32; H01P 1/36; H01P 1/38; H01P 1/383; H01P 1/387; H01P 1/39; H01P 1/393; H01P 1/397
See application file for complete search history.

(56) References Cited

U.S. PATENT DOCUMENTS

| 4,639,622 A | 1/1987 | Goodwin et al. |
| 6,559,689 B1 | 5/2003 | Clark |

(Continued)

FOREIGN PATENT DOCUMENTS

| WO | WO 2006029286 | 3/2006 |
| WO | WO 2018052935 | 3/2018 |
| WO | WO 2018075113 | 4/2018 |

OTHER PUBLICATIONS

Abdelhalem, S.H., et al., "Tunable CMOS Integrated Duplexer with Antenna Impedance Tracking and High Isolation in the Transmit and Receive Bands", In IEEE Trans. Microw. Theory Techn., vol. 62, No. 9, Sep. 2014, pp. 2092-2104.

(Continued)

*Primary Examiner* — Stephen E. Jones
(74) *Attorney, Agent, or Firm* — Byrne Poh LLP

(57) ABSTRACT

A circulator, comprising: a gyrator having a first side (1S) and a second side (2S) connected to a third port; a first transmission line section (TLS) having a 1 S connected to the 1 S of the gyrator and a 2S connected to a first port; a second TLS having a 1S connected to the first port and having a 2S connected to a second port; a third TLS having a 1S connected to the second port and having a 2S connected to the third port; a first cancellation path (CP) that is connected between the first port and the third port and (Continued)

introduces a current that is 90 degrees out of phase with a first voltage at the first port; and a second CP that is connected between the second port and the third port and introduces a current that is orthogonal to the current introduces by the first CP.

16 Claims, 20 Drawing Sheets

(56) References Cited

U.S. PATENT DOCUMENTS

| | | |
|---|---|---|
| 7,671,572 B2 | 3/2010 | Chung |
| 8,339,183 B2 | 12/2012 | Htoo et al. |
| 8,565,701 B2 | 10/2013 | Sanchez et al. |
| 8,576,752 B2 | 11/2013 | Sarca |
| 8,963,630 B2 | 2/2015 | Ceballos et al. |
| 9,253,875 B2 | 2/2016 | Lent et al. |
| 9,521,023 B2 | 12/2016 | Martinez et al. |
| 9,847,865 B2 | 12/2017 | Moher |
| 2006/0186948 A1 | 8/2006 | Kelly et al. |
| 2011/0299431 A1 | 12/2011 | Mikhemar et al. |
| 2014/0194074 A1 | 7/2014 | Klomsdorf et al. |
| 2015/0065065 A1 | 3/2015 | Rofougaran et al. |
| 2017/0005696 A1 | 1/2017 | Sjoland |
| 2017/0207532 A1 | 6/2017 | Wang |
| 2017/0257136 A1 | 9/2017 | Gianvittorio et al. |
| 2017/0353210 A1 | 12/2017 | Pratt et al. |

OTHER PUBLICATIONS

Ahn, H.R., et al., "New Isolation Circuits of Compact Impedance-Transforming 3-dB Baluns for Theoretically Perfect Isolation and Matching", In IEEE Transactions on Microwave Theory and Techniques, vol. 58, No. 12, Nov. 2010, pp. 3892-3902.

Allen, P., "The Turnstile Circulator", In IRE Trans. Microw. Theory Techn., vol. 4, No. 4, Oct. 1956, pp. 223-227.

Andrews, C. and Molnar, A.C., "A Passive Mixer-First Receiver with Digitally Controlled and Widely Tunable RF Interface", In IEEE Journal of Solid-State Circuits, vol. 45, No. 12, Dec. 2010, pp. 2696-2708.

Baldwin, L., "Nonreciprocal Parametric Amplifier Circuits", In Proc. of the Inst. Radio Eng., vol. 49, No. 6, Jan. 1961, p. 1075.

Bharadia, D., et al., "Full Duplex Radios", In Proc. of the ACM SIGCOMM Conf., Aug. 2013, pp. 375-386.

Biedka, M.M., et al., "Ultra-Wide Band Nonreciprocity through Sequentially-Switched Delay Lines", In Sci. Rep., vol. 7, art. No. 40014, Jan. 2017, pp. 1-16.

Bosma, H., "On Stripline Y-Circulation at UHF", In IEEE Trans. Microw. Theory Techn., vol. 12, No. 1, Jan. 1964, pp. 61-72.

Bult, K., "Analog Design in Deep Sub-Micron CMOS", In Proceedings of the European Solid-State Circuits Conference, Sep. 2000, pp. 11-17.

Carchon, G. and Nauwelaers, B., "Power and Noise Limitations of Active Circulators", In IEEE Trans. Microw. Theory Techn., vol. 48, No. 2, Feb. 2000, pp. 316-319.

Chandrakasan, A.P., et al., "Low-Power CMOS Digital Design", In IEEE Journal of Solid-State Circuits, vol. 27, No. 4, Apr. 1992, pp. 1-12.

Chang, D.Y. and Moon, U.K., "A 1.4-V 10-Bit25-MS/s Pipelined ADC Using Opamp-Reset Switching Technique", In IEEE Journal of Solid-State Circuits, vol. 38, No. 8, Jul. 2003, pp. 1401-1404.

Choi, J.I., et al., "Achieving Single Channel, Full-Duplex Wireless Communication", In Proc. of the 16th Annu. Int. Conf. Mobile Comput. Netw., Sep. 2010, pp. 1-12.

Dastjerdi, M.B., et al., "Full Duplex Circulator-Receiver Phased Array Employing Self-Interference Cancellation via Beamforming", In Proc. of the IEEE Radio Freq. Integr. Circuits Symp., Jun. 2018, pp. 108-111.

Debaillie, B., et al., "Analog/RF Solutions Enabling Compact Full-Duplex Radios", In IEEE J. of Sel. Areas Commun., vol. 32, No. 9, Sep. 2014, pp. 1662-1673.

Desai, N.V., et al., "An Actively Detuned Wireless Power Receiver with Public Key Cryptographic Authentication and Dynamic Power Allocation", In IEEE Journal of Solid-State Circuits, vol. 53, No. 1, Sep. 2017, pp. 236-246.

Dinc, T., et al., "A 60 GHz CMOS Full-Duplex Transceiver and Link with Polarization-Based Antenna and RF Cancellation", In IEEE J. of Solid-State Circuits, vol. 51, No. 5, May 2016, pp. 1125-1140.

Dinc, T., et al., "A Millimeter-Wave Non-Magnetic Passive SOI CMOS Circulator Based on Spatio-Temporal Conductivity Modulation", In IEEE Journal of Solid-State Circuits, vol. 52, No. 12, Dec. 2017, pp. 3276-3292.

Dinc, T., et al., "Synchronized Conductivity Modulation to Realize Broadband Lossless Magnetic-Free Non-Reciprocity", In Nature Commun., vol. 8, Oct. 2017, p. 765.

Dokic, B.L., et al., "Low-Voltage Low-Power CMOS Design", In Proceedings of the 2016 Symposium on Industrial Electronics, Nov. 2016, pp. 1-6.

Elkholy, M., et al., "Low-Loss Integrated Passive CMOS Electrical Balance Duplexers with Single-Ended LNA", In IEEE Trans. Microw. Theory Techn., vol. 64, No. 5, May 2016, pp. 1544-1559.

Esser, D., et al., "Improved Antenna Isolation in Transmit/Receive Applications", In Proceedings of the German Microwave Conference, Mar. 2006, pp. 1-5.

Estep, N.A., et al., "Magnetic-Free Non-Reciprocity and Isolation Based on Parametrically Modulated Coupled-Resonator Loops", In Nature Phys., vol. 10, No. 12, Nov. 2014, pp. 923-927.

Estep, N.A., et al., "Magnetless Microwave Circulators Based on Spatiotemporally Modulated Rings of Coupled Resonators", In IEEE Trans. Microw. Theory Techn., vol. 64, No. 2, Feb. 2016, pp. 502-518.

Fan, L., et al., "An All-Silicon Passive Optical Diode", In Science, vol. 335, Jan. 2012, pp. 447-450.

Fayomi, C.J.B. and Roberts, G.W., "Design and Characterization of Low-Voltage Analog Switch Without the Need for Clock Boosting", In Proceedings of the 47th Midwest Symposium on Circuits and Systems, Jul. 2004, pp. 1-4.

Gallo, K., et al., "All-Optical Diode in a Periodically Poled Lithium Niobate Waveguide", In Appl. Phys. Lett., vol. 79, No. 3, Jul. 2001, pp. 314-316.

Hamasaki, J., "A Theory of a Unilateral Parametric Amplifier Using Two Diodes", In Bell Syst. Tech. J., vol. 43, No. 3, May 1964, pp. 1123-1147.

International Preliminary Report on Patentability dated Dec. 15, 2020 in International Patent Application No. PCT/US2019/036628, pp. 1-6.

International Search Report and Written Opinion dated Jan. 30, 2020 in International Patent Application No. PCT/US2019/036628, pp. 1-11.

International Search Report and Written Opinion dated Apr. 8, 2020 in International Patent Application No. PCT/US2020/014487, pp. 1-12.

Kamal, A.K., "A Parametric Device as a Nonreciprocal Element", In Proc, of the IRE, vol. 48, No. 8, Aug. 1960, pp. 1424-1430.

Keskin, M., "A Low-Voltage CMOS Switch with a Novel Clock Boosting Scheme", In IEEE Transactions on Circuits and Systems II: Express Briefs, vol. 54, No. 4, Jul. 2005, pp. 185-188.

Koochakzadeh, M. and Abbaspour-Tamijani, A., "Miniaturized Transmission Lines Based on Hybrid Lattice-Ladder Topology", In IEEE Trans. Microw. Theory Techn., vol. 58, No. 4, Apr. 2010, pp. 949-955.

Kord, A., et al., "Broadband Cyclic-Symmetric Magnetless Circulators and Theoretical Bounds on their Bandwidth", In IEEE Trans. Microw. Theory Techn., vol. 66, No. 12, Dec. 2018, pp. 5472-5481.

Kord, A., et al., "Low-Loss Broadband Magnetless Circulators for Full-Duplex Radios", In IEEE/MTT-S Int. Microw. Symp. Tech. Dig., Jun. 2018, pp. 506-509.

Korpi, D., et al., "Full-Duplex Mobile Device: Pushing the Limits", In IEEE Commun. Mag., vol. 54, No. 9, Sep. 2016, pp. 80-87.

(56) References Cited

OTHER PUBLICATIONS

Kumar, S., et al., "An Ultra-Low Power CMOS DC-DC Buck Converter with Double-Chain Digital PWM Technique", In Journal of Analog Integrated Circuits and Signal Processing, vol. 92, No. 1, Jul. 2017, pp. 141-149.

Lim, W.G., et al., "Transmitter and Receiver Isolation by Concentric Antenna Structure", In IEEE Transactions on Antennas and Propagation, vol. 58, No. 10, Jul. 2010, pp. 3182-3188.

Mikhemar, M., et al., "A Multiband RF Antenna Duplexer on CMOS: Design and Performance", In IEEE Journal of Solid-State Circuits, vol. 48, No. 9, Sep. 2013, pp. 2067-2077.

Nagulu, A., et al., "Fully-Integrated Nonmagnetic 180 nm SOI Circulator with > 1W P1 dB, > +50 dBm IIP3 and High Isolation Across 1.85 VSWR", In Proc. of the IEEE Radio Freq. Integr. Circuits Symp. (RFIC), Jun. 2018, p. 104-107.

Nagulu, A., et al., "Nonreciprocal Components based on Switched Transmission Lines", In IEEE Trans. Microw. Theory Techn., vol. 66, No. 11, Nov. 2018, pp. 4706-4725.

Oh, T., et al., "A Low-Power CMOS Piezoelectric Transducer Based Energy Harvesting Circuit for Wearable Sensors for Medical Applications", In Journal of Low Power Electronics and Applications, vol. 7, No. 33, Dec. 2017, pp. 1-11.

Peng, B., et al., "Parity—Time-Symmetric Whispering-Gallery Microcavities", In Nature Phys., vol. 10, Apr. 6, 2014, pp. 394-398.

Qi, G., et al., "A SAW-Less Tunable RF Front End for FDD and IBFD Combining an Electrical-Balance Duplexer and a Switched-LCN-Path LNA", In IEEE Journal of Solid-State Circuits, vol. 53, No. 5, May 2018, pp. 1431-1442.

Qin, S., et al., "Nonreciprocal Components with Distributedly Modulated Capacitors", In IEEE Trans. Microw. Theory Techn., vol. 62, No. 10, Oct. 2014, pp. 2260-2272.

Reiskarimian, N. and Krishnaswamy, H., "Magnetic-Free Non-Reciprocity based on Staggered Commutation", In Nature Commun., vol. 7, art. No. 11217, Apr. 2016, pp. 1-10.

Reiskarimian, N., et al., "A CMOS Passive LPTV Nonmagnetic Circulator and its Application in a Full-Duplex Receiver", In IEEE J. of Solid-State Circuits, vol. 52, No. 5, May 2017, pp. 1358-1372.

Reiskarimian, N., et al., "Analysis and Design of Commutation-Based Circulator-Receivers for Integrated Full-Duplex Wireless", In IEEE J. of Solid-State Circuits, vol. 53, No. 8, Aug. 2018, pp. 2190-2201.

Reiskarimian, N., et al., "Integrated Conductivity-Modulation-Based RF Magnetic-Free Nonreciprocal Components: Recent Results and Benchmarking", In IEEE Antennas Wireless Propag. Lett., vol. 17, No. 11, Nov. 2018, pp. 1978-1982.

Sabharwal, A., et al., "In-Band Full-Duplex Wireless: Challenges and Opportunities", In IEEE J. of Sel. Areas Commun., vol. 32, No. 9, Sep. 2014, pp. 1637-1652.

Sounas, D., et al., "Broadband Passive Isolators Based on Coupled Nonlinear Resonances", In Nature Electron., vol. 1, Feb. 2008, pp. 113-119.

Tanaka, S., et al., "Active Circulators—The Realization of Circulators Using Transistors", In Proc. of the IEEE, vol. 53, No. 3, Mar. 1965, pp. 260-267.

Tellegen, B.D.H., "The Gyrator, a New Electric Network Element", In Philips Res. Rep., vol. 3, No. 2, Apr. 1948, pp. 81-101.

Tyagi, S., et al., "An Advanced Low Power, High Performance, Strained Channel 65nm Technology", In IEDM Tech. Dig., Dec. 2005, pp. 245-247.

van den Broek, D.J., et al., "An In-Band Full-Duplex Radio Receiver with a Passive Vector Modulator Downmixer for Self-Interference Cancellation", In IEEE Journal of Solid-State Circuits, vol. 50, No. 12, Dec. 2015, pp. 3003-3014.

van Liempd, B., et al., "2.2 A +70 dBm IIP3 Single-Ended Electrical-Balance Duplexer in 0.18 µm SOI CMOS", In IEEE ISSCC Dig. Tech. Papers, San Francisco, CA, US, Feb. 22-26, 2015, pp. 1-3.

van Liempd, B., et al., "Adaptive RF Front-Ends Using Electrical-Balance Duplexers and Tuned Saw Resonators", In IEEE Trans. Microw. Theory Techn., vol. 65, No. 11, Nov. 2017, pp. 4621-4628.

van Liempd, B., et al., "An Electrical-Balance Duplexer for In-Band Full-Duplex with <-85 dBm In-Band Distortion at +10 dBm TX-Power", In Proceedings of the 41st European Solid-State Circuits Conference, Sep. 2015, pp. 176-179.

Wang, S., et al., "Fully Integrated 10-GHz Active Circulator and Quasi-Circulator Using Bridged-T Networks in Standard CMOS", In IEEE Trans. Very Large Scale Integr. Syst., vol. 24, No. 10, Oct. 2016, pp. 3184-3192.

Yang, D., et al., "A Wideband Highly Integrated and Widely Tunable Transceiver for In-Band Full-Duplex Communication", In IEEE Journal of Solid-State Circuits, vol. 50, No. 5, May 2015, pp. 1189-1202.

Zhang, T., et al., "Wideband Dual-Injection Path Self-Interference Cancellation Architecture for Full-Duplex Transceivers", In IEEE Journal of Solid-State Circuits, vol. 53, No. 5, Jun. 2018, pp. 1563-1576.

Zhou, J., et al., "Integrated Full Duplex Radios", In IEEE Commun. Mag., vol. 55, No. 4, Apr. 2017, pp. 142-151.

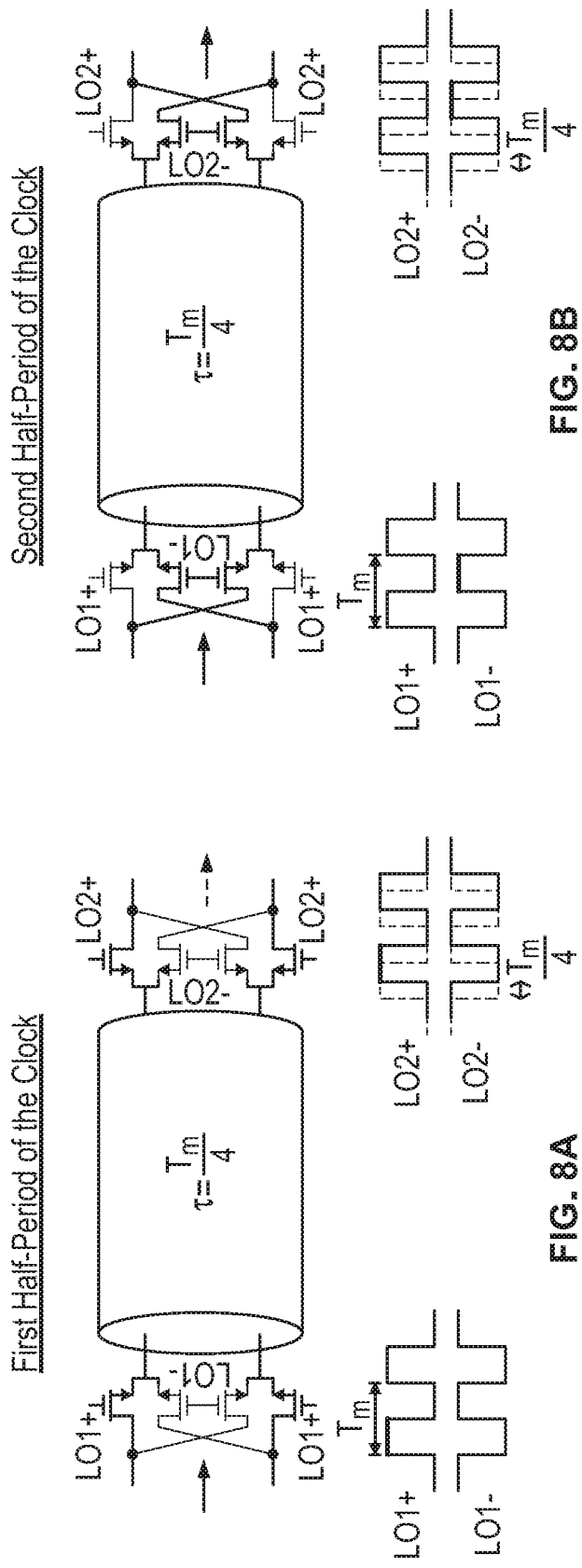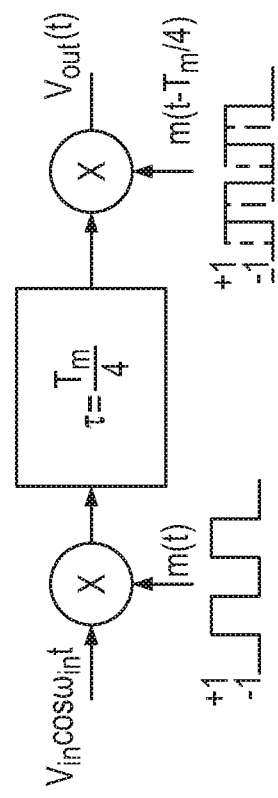
FIG. 8A
FIG. 8B
FIG. 8C

CIRCUITS AND METHODS FOR CIRCULATORS INCLUDING A PLURALITY OF CANCELLATION PATHS

CROSS REFERENCE TO RELATED APPLICATION

This application claims the benefit of U.S. Provisional Patent Application No. 62/683,541, filed Jun. 11, 2018, which is hereby incorporated by reference herein in its entirety.

STATEMENT REGARDING GOVERNMENT FUNDED RESEARCH

This invention was made with government support under Grant No. HR0011-17-2-0007 awarded by the Department of Defense (DOD) and the Defense Advanced Research Projects Agency (DARPA). The government has certain rights in the invention.

BACKGROUND

Full-duplex communications, in which a transmitter and a receiver of a transceiver operate simultaneously on the same frequency band, is drawing significant interest for emerging 5G communication networks due to its potential to double network capacity compared to half-duplex communications. Additionally, there are several efforts underway to include simultaneous transmit and receive functionality in the next generation phased array radar systems, especially in commercial automotive radars which can be an enabler technology for future connected or driverless cars. However, one of the biggest challenges from an implementation perspective is the antenna interface.

One way in which an antenna interface for a full-duplex transceiver can be implemented is using a non-reciprocal circulator. Reciprocity in electronics is a fundamental property of linear systems and materials described by symmetric and time-independent permittivity and permeability tensors. Non-reciprocity causes signals to travel in only one direction. For example, non-reciprocity in a circulator causes signals to travel in only one direction through the circulator. This directional signal flow enables full-duplex wireless communications because signals from the transmitter are only directed toward the antenna (and not the receiver) and received signals at the antenna are only directed toward the receiver (and not the transmitter). Moreover, the receiver is isolated from signals from the transmitter, preventing desensitization and possible breakdown of the receiver due to the high-power transmitted signal.

Conventionally, non-reciprocal circulators have been implemented using ferrite materials, which are materials that lose their reciprocity under the application of an external magnetic field. However, ferrite materials cannot be integrated into CMOS IC technology. Furthermore, the need for an external magnet renders ferrite-based circulators bulky and expensive.

Accordingly, new mechanisms for implementing non-reciprocity in circuits is desirable.

SUMMARY

Circuits and methods for circulators including a plurality of cancellation paths are provided. In some embodiments, circulators are provided, the circulators comprising: a gyrator having a first side and having a second side connected to a third port; a first transmission line section having a first side connected to the first side of the gyrator and a second side connected to a first port; a second transmission line section having a first side connected to the first port and having a second side connected to a second port; a third transmission line section having a first side connected to the second port and having a second side connected to the third port; a first cancellation path that is connected between the first port and the third port and that introduces a current that is 90 degrees out of phase with a first voltage at the first port; and a second cancellation path that is connected between the second port and the third port and that introduces a current that is orthogonal to the current introduces by the first cancellation path.

BRIEF DESCRIPTION OF THE DRAWINGS

FIGS. 8A, 8B, and 8C are examples of the operation of the element of FIG. 7 with a signal propagating from left to right in accordance with some embodiments.

DETAILED DESCRIPTION

FIGS. 1A, 1B, 1C, and 1D show an example of how a non-reciprocal phase shift can be implemented in some embodiments.

Figure 1C:
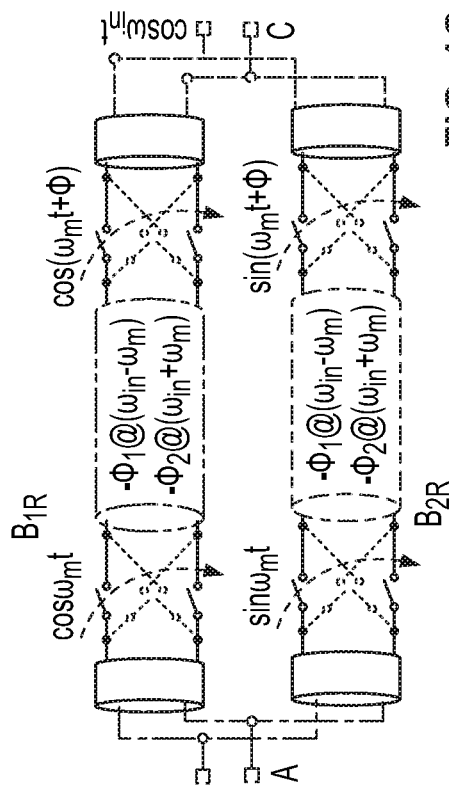
FIGS. 1A, 1B, 1C, and 1D are example illustrations of how a non-reciprocal phase shift can be implemented in accordance with some embodiments.
Figure 1D:
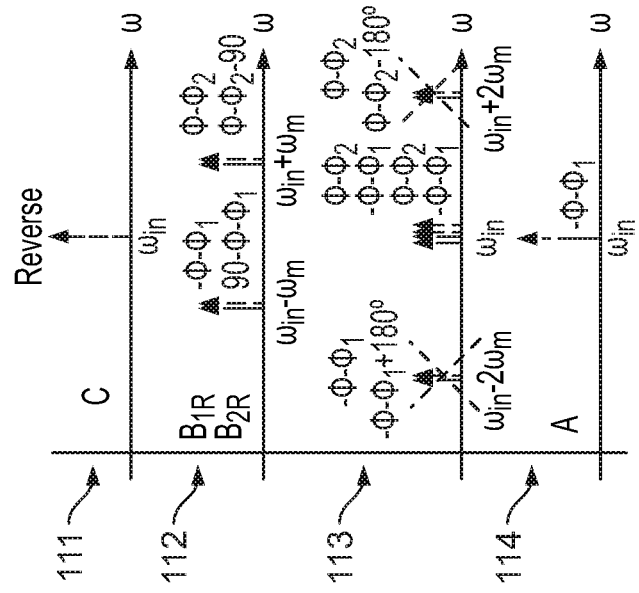
Figure 1A:
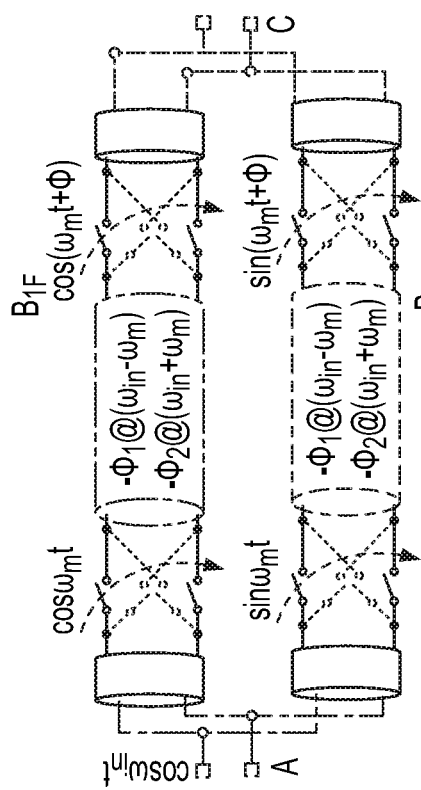
Figure 1B:
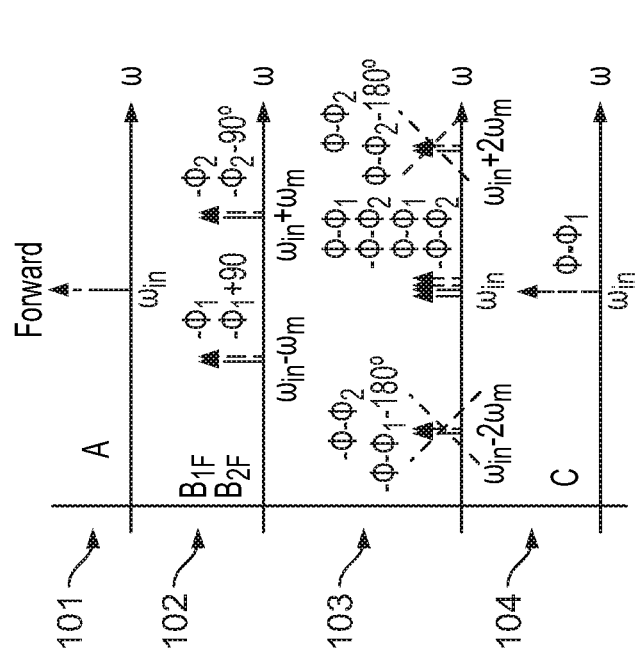

Turning to FIG. 1A, it can be seen that a signal $\cos(\omega_{in}t)$ can be injected at nodes A. This is represented in graph 101 of FIG. 1B. As shown in FIG. 1A, the switch groups can then be switched by the following signals: $\cos(\omega_m t)$; $\cos(\omega_m t+\Phi)$; $\sin(\omega_m t)$; and $\sin(\omega_m t+\Phi)$, where $\Phi$ is 90°. $\Phi_1$ and $\Phi_2$ shown in FIGS. 1A and 1B relate to $\Phi$ according to the following equation: $2\Phi=180=\Phi_1-\Phi_2$ (or equivalently, $2*Td*\omega_m/\pi=1$ where Td is the delay of the transmission lines). As a result of the switching at the switch groups closest to nodes A, the input signal is commutated and two mixing products appear after the commutation on each transmission line at $\omega_{in}-\omega_m$ and $\omega_{in}+\omega_m$. These signals then flow through the top and bottom transmission lines (which provide $-\Phi_1$ and $-\Phi_2$ phase shifts at $\omega_{in}-\omega_m$ and $\omega_{in}+\omega_m$, respectively). The mixing tones flowing through the top transmission line appear at node $B_{1F}$ with total phase shifts of and $-\Phi_2$ at $\omega_{in}-\omega_m$ and $\omega_{in}+\omega_m$, respectively. The mixing tones flowing through the bottom line appear at node $B_{2F}$ with total phase shifts of $-\Phi_1+90°$ and $-\Phi_2-90°$ at $\omega_{in}-\omega_m$ and $\Phi_{in}+\omega_m$, respectively. This is shown in graph 102 of FIG. 1B. The phase shifted signals are then commutated again at $\omega_m$, by the switch groups closest to nodes C, but with a phase shift of 1. For each of the four signals in graph 102, two mixing products appear after the commutation at nodes C (for a total of eight signals). As shown in graph 103 of FIG. 1B, the mixing products appear at $\omega_{in}-2\omega_m$, $\omega_{in}$, and $\omega_{in}+2\Phi_m$ with phase shifts as shown in the following table:

| Signal in Graph 102 | Mixing Product | Resulting Frequency | Resulting Phase Shift |
|---|---|---|---|
| $\omega_{in} - \omega_m, -\Phi_1$ | 1 | $\omega_{in} - 2\omega_m$ | $-\Phi - \Phi_1$ |
| $\omega_{in} - \omega_m, -\Phi_1$ | 2 | $\omega_{in}$ | $\Phi - \Phi_1$ |
| $\omega_{in} + \omega_m, -\Phi_2$ | 1 | $\omega_{in}$ | $-\Phi - \Phi_2 = \Phi - \Phi_1$ |
| $\omega_{in} + \omega_m, -\Phi_2$ | 2 | $\omega_{in} + 2\omega_m$ | $\Phi - \Phi_2$ |
| $\omega_{in} - \omega_m, -\Phi_1 + 90°$ | 1 | $\omega_{in} - 2\omega_m$ | $-\Phi - \Phi_1 + 180°$ |
| $\omega_{in} - \omega_m, -\Phi_1 + 90°$ | 2 | $\omega_{in}$ | $\Phi - \Phi_1$ |
| $\omega_{in} + \omega_m, -\Phi_2 - 90°$ | 1 | $\omega_{in}$ | $-\Phi - \Phi_2 = \Phi - \Phi_1$ |
| $\omega_{in} + \omega_m, -\Phi_2 - 90°$ | 2 | $\omega_{in} + 2\omega_m$ | $\Phi - \Phi_2 - 180°$ |

As can be seen, the signals at $\omega_{in}-2\omega_{in}$ and $\omega_{in}+2\Phi_m$ are 180° out of phase and thus cancel out. Also, the signals at $\omega_{in}$ all have the same phase, and thus add up into a single signal with a phase shift of $\Phi-\Phi_1$, or $90°-\Phi_1$. This is shown in graph 104 of FIG. 1B.

Turning to FIG. 1C, it can be seen that a signal $\cos(\omega_{in}t)$ can be injected at nodes C. This is represented in graph 111 of FIG. 1D. As shown in FIG. 1C, the switch groups are switched by the following signals: $\cos(\omega_m t)$; $\cos(\omega_m t+\Phi)$; $\sin(\omega_m t)$; and $\sin(\omega_m t+\Phi)$, where $\Phi$ is 90°. $\Phi_1$ and $\Phi_2$ shown in FIGS. 1C and 1D relate to $\Phi$ according to the following equation: $2\Phi=180=\Phi_1-\Phi_2$ (or equivalently, $2*Td*\omega_m/\pi=1$ where Td is the delay of the transmission lines). As a result of the switching at the switch groups closest to nodes C, the input signal is commutated and two mixing products appear after the commutation on each transmission line at $\omega_{in}-\omega_m$ (with phase shifts of $-\Phi$) and $\omega_{in}+\omega_m$ (with phase shifts of 1). These signals then flow through the top and bottom transmission lines (which provide $-\Phi_1$ and $-\Phi_2$ phase shifts at $\omega_{in}-\omega_m$ and $\omega_{in}+\omega_m$, respectively). The mixing tones flowing through the top transmission line appear at node $B_{1R}$ with total phase shifts of $-\Phi-\Phi_1$ and $\Phi-\Phi_2$ at $\omega_{in}-\omega_m$ and $\omega_{in}+\omega_m$, respectively. The mixing tones flowing through the bottom line appear at node $B_{2R}$ with total phase shifts of $90°-\Phi-\Phi_1$ and $-90°+\Phi-\Phi_2$ at $\omega_{in}-\omega_m$ and $\omega_{in}+\omega_m$, respectively. This is shown in graph 112 of FIG. 1D. The phase shifted signals are then commutated again at $\omega_{in}$, by the switch groups closest to nodes A. For each of the four signals in graph 112, two mixing products appear after the commutation at nodes A (for a total of eight signals). As shown in graph 113 of FIG. 1D, the mixing products appear at $\omega_{in}-2\omega_m$, $\omega_{in}$, and $\omega_{in}+2\omega_{in}$ with phase shifts as shown in the following table:

| Signal in Graph 112 | Mixing Product | Resulting Frequency | Resulting Phase Shift |
|---|---|---|---|
| $\omega_{in} - \omega_m, -\Phi - \Phi_1$ | 1 | $\omega_{in} - 2\omega_m$ | $-\Phi - \Phi_1$ |
| $\omega_{in} - \omega_m, -\Phi - \Phi_1$ | 2 | $\omega_{in}$ | $-\Phi - \Phi_1$ |
| $\omega_{in} + \omega_m, \Phi - \Phi_2$ | 1 | $\omega_{in}$ | $\Phi - \Phi_2 = -\Phi - \Phi_1$ |
| $\omega_{in} + \omega_m, \Phi - \Phi_2$ | 2 | $\omega_{in} + 2\omega_m$ | $\Phi - \Phi_2$ |
| $\omega_{in} - \omega_m, 90° - \Phi - \Phi_1$ | 1 | $\omega_{in} - 2\omega_m$ | $-\Phi - \Phi_1 + 180°$ |
| $\omega_{in} - \omega_m, 90° - \Phi - \Phi_1$ | 2 | $\omega_{in}$ | $-\Phi - \Phi_1$ |
| $\omega_{in} + \omega_m, \Phi - \Phi_2 - 90°$ | 1 | $\omega_{in}$ | $\Phi - \Phi_2 = -\Phi - \Phi_1$ |
| $\omega_{in} + \omega_m, \Phi - \Phi_2 - 90°$ | 2 | $\omega_{in} + 2\omega_m$ | $\Phi - \Phi_2 - 180°$ |

As can be seen, the signals at $\omega_{in}-2\omega_m$ and $\omega_{in}+2\omega_m$ are 180° out of phase and thus cancel out. Also, the signals at $\omega_{in}$ all have the same phase, and thus add up into a single signal with a phase shift of $-\Phi-\Phi_1$, or $-90°-\Phi_1$. This is shown in graph 114 of FIG. 1D.

As can be seen in graphs 104 and 114 of FIGS. 1C and 1D, respectively, the signals at $\omega_{in}$ incur different phase shifts in the forward and reverse direction ($\Phi-\Phi_1$ and $-\Phi-\Phi_1$, respectively), demonstrating the phase non-reciprocity.

The scattering parameter matrix of the configuration shown in FIGS. 1A, 1B, 1C, and 1D can be represented by [S] as follows:

$$[S] = \begin{bmatrix} 0 & e^{j(-\phi-\phi_1)} \\ e^{j(\phi-\phi_1)} & 0 \end{bmatrix}$$

where: j is the square root of $-1$. The $\phi$ in the term on the top right corner and $+\phi$ in the term on the bottom left corner show that the phase is non-reciprocal.

FIGS. 2A, 2B, 2C, and 2D show an example of how non-reciprocal amplitude (an isolator) can be implemented in some embodiments.

Figure 2A:
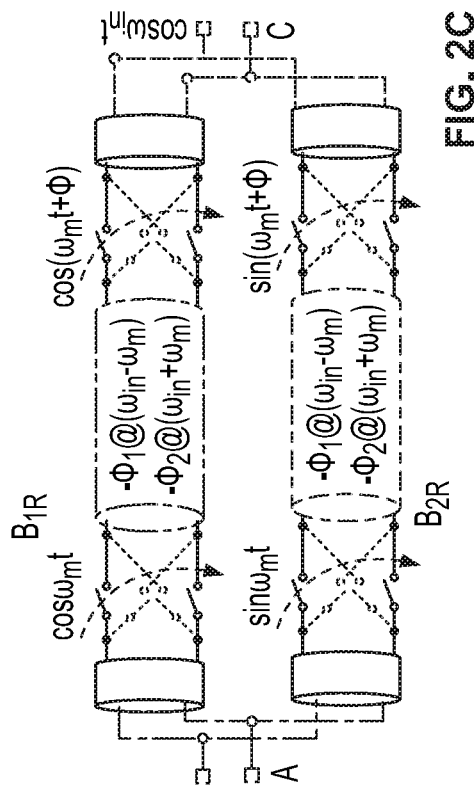
FIGS. 2A, 2B, 2C, and 2D are example illustrations of how non-reciprocal amplitude (an isolator) can be implemented in some embodiments.
Figure 2B:
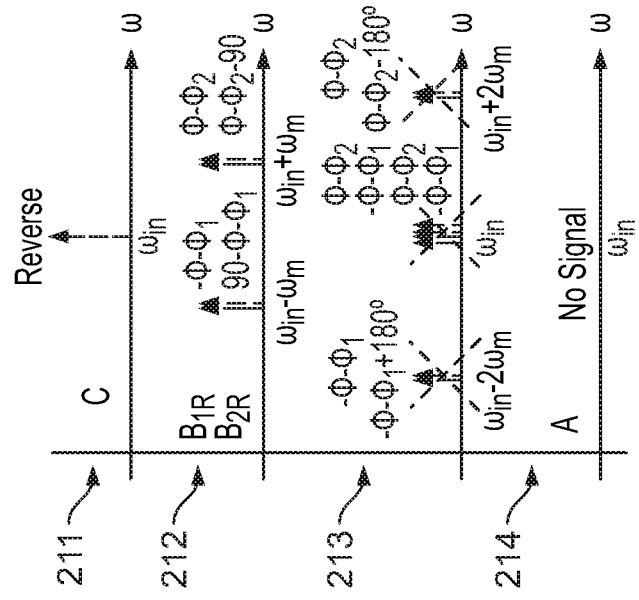

Turning to FIG. 2A, it can be seen that a signal $\cos(\omega_{in}t)$ is injected at nodes A. This is represented in graph 201 of FIG. 2B. As shown in FIG. 2A, the switch groups are switched by the following signals: $\cos(\omega_m t)$; $\cos(\omega_m t+\Phi)$; $\sin(\omega_m t)$; and $\sin(\omega_m t+\Phi)$, where $\Phi$ is 45°. $\Phi_1$ and $\Phi_2$ shown in FIGS. 2A and 2B relate to $\Phi$ according to the following equation: $2\Phi=90°=\Phi_1-\Phi_2$ (or equivalently, $4*T_d*\omega_m/\pi=1$ where $T_d$ is the delay of the transmission lines). As a result of the switching at the switch groups closest to nodes A, the input signal is commutated and two mixing products appear after the commutation on each transmission line at $\omega_{in}-\omega_m$ and $\Phi_{in}+\omega_m$. These signals then flow through the top and bottom transmission lines (which provide and $-\Phi_2$ phase shifts at $\omega_{in}-\omega_m$ and $\omega_{in}+\omega_m$, respectively). The mixing tones flowing through the top transmission line appear at node $B_{1F}$ with total phase shifts of $-\Phi_1$ and $-\Phi_2$ at $\omega_{in}-\omega_m$ and $\omega_{in}+\omega_m$, respectively. The mixing tones flowing through the bottom line appear at node $B_{2F}$ with total phase shifts of $-\Phi_1+90°$ and $-\Phi_2-90°$ at $\omega_{in}-\omega_m$ and $\omega_{in}+\omega_m$, respectively. This is shown in graph 202 of FIG. 2B. The phase shifted signals are then commutated again at (Um, by the switch groups closest to nodes C, but with a phase shift of 1. For each of the four signals in graph 202, two mixing products appear after the commutation at nodes C (for a total of eight signals). As shown in graph 203 of FIG. 2B, the mixing products appear at $\omega_{in}-2\omega_m$, $\omega_{in}$, and $\omega_{in}+2\omega_m$ with phase shifts as shown in the following table:

| Signal in Graph 202 | Mixing Product | Resulting Frequency | Resulting Phase Shift |
|---|---|---|---|
| $\omega_{in} - \omega_m, -\Phi_1$ | 1 | $\omega_{in} - 2\omega_m$ | $-\Phi - \Phi_1$ |
| $\omega_{in} - \omega_m, -\Phi_1$ | 2 | $\omega_{in}$ | $\Phi - \Phi_1 = 45° - \Phi_1$ |
| $\omega_{in} + \omega_m, -\Phi_2$ | 1 | $\omega_{in}$ | $-\Phi - \Phi_2 = \Phi - \Phi_1 = 45° - \Phi_1$ |
| $\omega_{in} + \omega_m, -\Phi_2$ | 2 | $\omega_{in} + 2\omega_m$ | $\Phi - \Phi_2$ |
| $\omega_{in} - \omega_m, -\Phi_1 + 90°$ | 1 | $\omega_{in} - 2\omega_m$ | $-\Phi - \Phi_1 - 180°$ |
| $\omega_{in} - \omega_m, -\Phi_1 + 90°$ | 2 | $\omega_{in}$ | $\Phi - \Phi_1 = 45° - \Phi_1$ |
| $\omega_{in} + \omega_m, -\Phi_2 - 90°$ | 1 | $\omega_{in}$ | $-\Phi - \Phi_2 = \Phi - \Phi_1 = 45° - \Phi_1$ |
| $\omega_{in} + \omega_m, -\Phi_2 - 90°$ | 2 | $\omega_{in} + 2\omega_m$ | $\Phi - \Phi_2 - 180°$ |

As can be seen, the signals at $\omega_{in}-2\omega_{in}$ and $\omega_{in}+2\Phi_m$ are 180° out of phase and thus cancel out. Also, the signals at $\omega_{in}$ all have the same phase, and thus add up into a single signal with a phase shift of $\Phi-\Phi_1$, or $45°-\Phi_1$. This is shown in graph 204 of FIG. 2B.

Figure 2C:
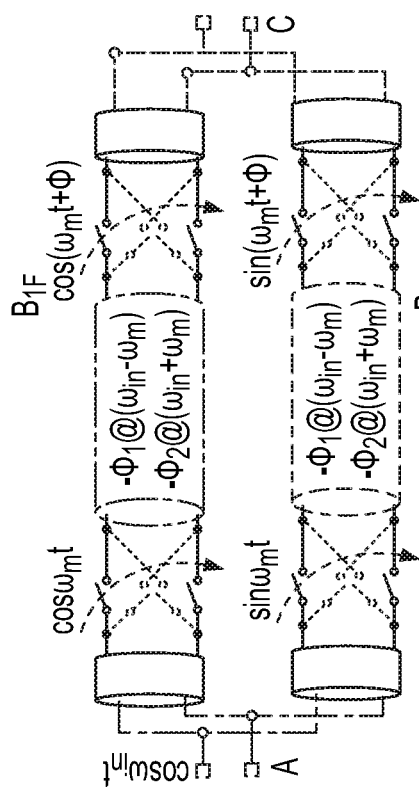

Turning to FIG. 2C, it can be seen that a signal $\cos(\omega_{in}t)$ is injected at nodes C. This is represented in graph 211 of FIG. 2D. As shown in FIG. 2C, the switch groups are switched by the following signals: $\cos(\omega_m t)$; $\cos(\omega_m t+\Phi)$; $\sin(\omega_m t)$; and $\sin(\omega_m t+\Phi)$, where $\Phi$ is 45°. $\Phi_1$ and $\Phi_2$ shown in FIGS. 2C and 2D relate to $\Phi$ according to the following equation: $2\Phi=90=\Phi_1-\Phi_2$ (or equivalently, $4*T_d*\omega_m/\pi=1$ where Td is the delay of the transmission lines). As a result of the switching at the switch groups closest to nodes C, the input signal is commutated and two mixing products appear after the commutation on each transmission line at $\omega_{in}-\omega_m$ (with phase shifts of $-\Phi$) and $\omega_{in}+\omega_m$ (with phase shifts of $\Phi$). These signals then flow through the top and bottom transmission lines (which provides $-\Phi_1$ and $-\Phi_2$ phase shifts at $\omega_{in}-\omega_m$ and $\omega_{in}+\omega_m$, respectively) The mixing tones flowing through the top transmission line appear at node B1R with total phase shifts of $-\Phi-\Phi_1$ and $\Phi-\Phi_2$ at $\omega_{in}-\omega_m$ and $\omega_{in}+\omega_m$, respectively. On the other hand, the mixing tones flowing through the bottom line appear at node B2R with total phase shifts of $90°-\Phi-\Phi_1$ and $-90°+41)-\Phi_2$ at $\omega_{in}-\omega_m$ and $\omega_{in}+\omega_m$, respectively. This is shown in graph 212 of FIG. 2D. The phase shifted signals are then commutated again at $\omega_m$, by the switch groups closest to nodes A. For each of the four signals in graph 212, two mixing products appear after the commutation at nodes A (for a total of eight signals). As shown in graph 213 of FIG. 2D, the mixing products appear at $\omega_{in}-2\omega_m$, $\omega_{in}$, and $\omega_{in}+2\omega_m$ with phase shifts as shown in the following table:

| Signal in Graph 212 | Mixing Product | Resulting Frequency | Resulting Phase Shift |
|---|---|---|---|
| $\omega_{in} - \omega_m, -\Phi - \Phi_1$ | 1 | $\omega_{in} - 2\omega_m$ | $-\Phi - \Phi_1$ |
| $\omega_{in} - \omega_m, -\Phi - \Phi_1$ | 2 | $\omega_{in}$ | $-\Phi - \Phi_1$ |
| $\omega_{in} + \omega_m, \Phi - \Phi_2$ | 1 | $\omega_{in}$ | $\Phi - \Phi_2 = -\Phi - \Phi_1$ |
| $\omega_{in} + \omega_m, \Phi - \Phi_2$ | 2 | $\omega_{in} + 2\omega_m$ | $\Phi - \Phi_2$ |
| $\omega_{in} - \omega_m, 90° - \Phi - \Phi_1$ | 1 | $\omega_{in} - 2\omega_m$ | $-\Phi - \Phi_1 - 180°$ |
| $\omega_{in} - \omega_m, 90° - \Phi - \Phi_1$ | 2 | $\omega_{in}$ | $-\Phi - \Phi_1$ |
| $\omega_{in} + \omega_m, \Phi - \Phi_2 - 90°$ | 1 | $\omega_{in}$ | $\Phi - \Phi_2 = -\Phi - \Phi_1$ |
| $\omega_{in} + \omega_m, \Phi - \Phi_2 - 90°$ | 2 | $\omega_{in} + 2\omega_m$ | $\Phi - \Phi_2 - 180°$ |

As can be seen, the signals at $\omega_{in}-2\omega_m$, $\omega_{in}$, and $\omega_{in}+2\omega_m$ are 180° out of phase and thus cancel out. This is shown in graph 214 of FIG. 2D.

Figure 2D:
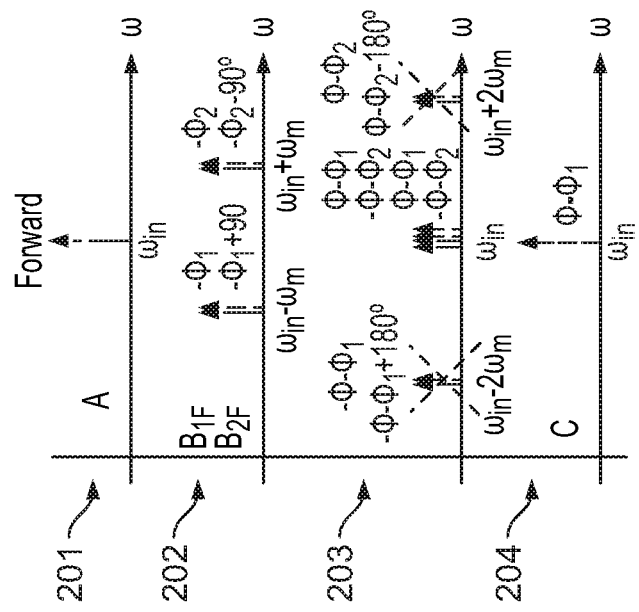

As can be seen in graphs 204 and 214 of FIGS. 2C and 2D, respectively, the signal at $\omega_{in}$ can only pass in the forward direction while it is completely attenuated in the reverse direction, showing amplitude non-reciprocity.

FIGS. 2A, 2B, 2C, and 2D describe an isolator configuration, where signals can travel in one direction but not the reverse direction. An isolator is like one arm of a circulator. It is useful because it can be placed between a power amplifier and its antenna, and it will protect the power amplifier from back reflections at the antenna.

Another use of the structures of FIGS. 1A, 1B, 2A, and 2B is a 2D lattice of such structures which can have a programmable signal propagation based on the phase shifts of the different switches.

In FIGS. 1A, 1B, 2A, and 2B, mixing products at $\omega_{in}-\omega_m$ and $\omega_{in}+\omega_m$ have been shown for simplicity, but, in reality, square-wave commutation can produce mixing products at offsets equal to all odd multiples of $\omega_m$.

Figure 3:
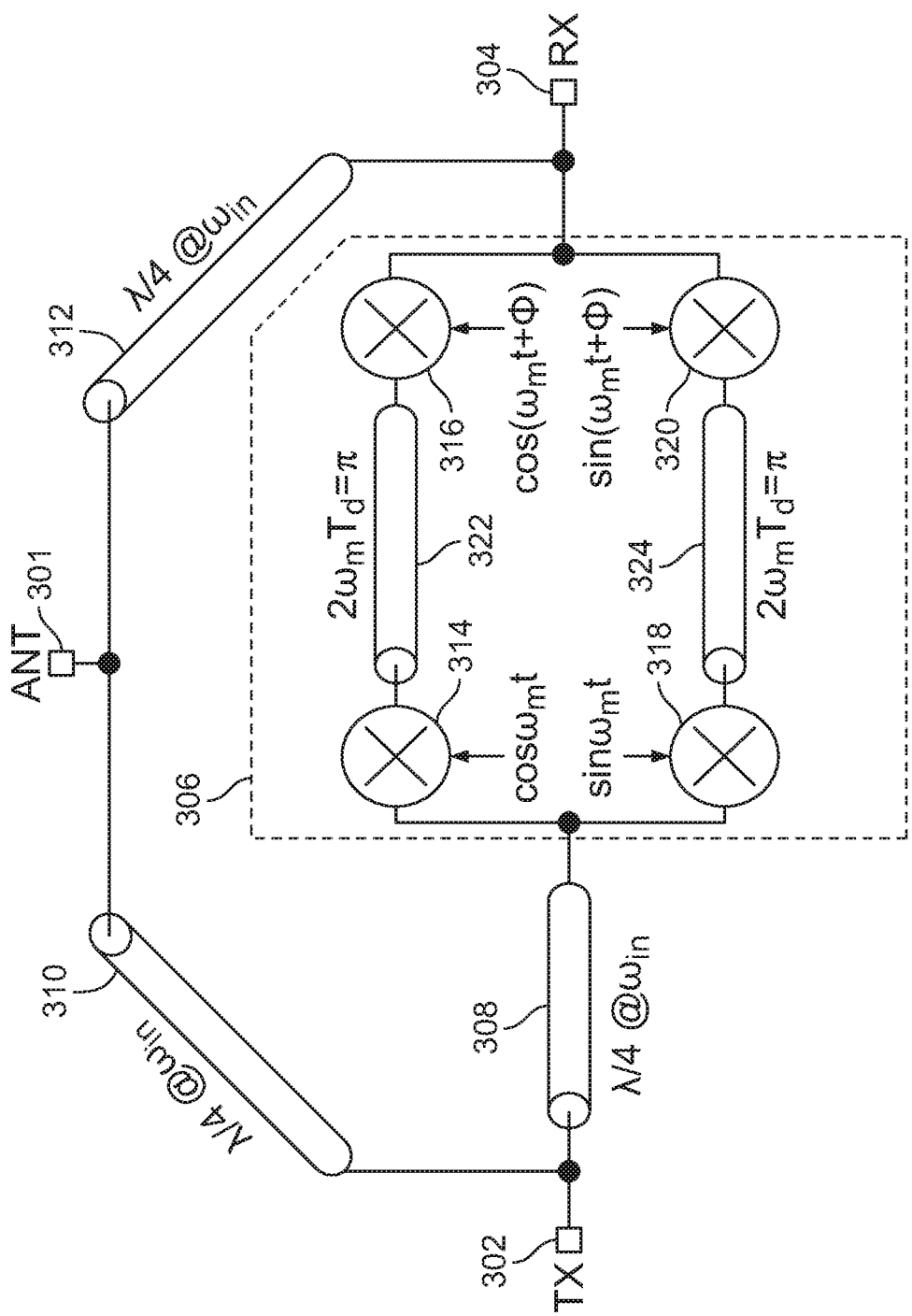
FIG. 3 is an example of a circulator architecture in accordance with some embodiments.

Turning to FIG. 3, an example 300 of a circulator architecture in accordance with some embodiments is shown. As illustrated, circulator 300 includes an antenna port 301, a transmitter port 302, a receiver port 304, a non-reciprocal phase component 306, and transmission lines 308, 310, and 312. Within non-reciprocal phase component 306, there are passive mixers 314, 316, 318, and 320, and transmission lines 322 and 324.

As shown in FIG. 3, values of signals and components in non-reciprocal phase component 306 may depend on an input frequency ($\omega_{in}$) and a modulation frequency ($\omega_m$). $\omega_{in}$ represents the frequency of operation of the circulator. $\omega_m$ represents the frequency at which the mixers are modulated. Any suitable frequencies can be used for $\omega_{in}$ and $\omega_m$, in some embodiments. For example, in some embodiments, RF/millimeter-wave/Terahertz frequencies can be used. In some embodiments, $\omega_{in}$ and $\omega_m$ may be required to be sized relative to each other. For example, in some embodiments, the mixing signals at $\omega_{in}+\omega_m$ and $\omega_{in}-\omega_m$ should be 180° out of phase or equivalently the following equation may be required to be met: $2\omega T_d=180°$, where $T_d$ is the group delay. In some embodiments, $\omega_m$ can be one third of $\omega_{in}$. More particularly, for example, in some embodiments, $\omega_{in}$ can be 28 GHz and $\omega_m$ can be 9.33 GHz.

Each of the transmission lines in FIG. 3 is illustrated as having a "length" that is based on a given frequency. For example, transmission lines 308, 310, and 312 are illustrated as having a length equal to $\lambda/4$, where $\lambda$ is the wavelength for a frequency of $\omega_{in}$. As another example, transmission lines 322 and 324 are illustrated as providing 180° phase difference between the signals at $\omega_{in}+\omega_m$ and $\omega_{in}-\omega_m$ or equivalently a group delay of $T_d=\frac{1}{4}(\omega_m/2\pi)$.

Transmission lines 308, 310, 312, 322, and 324 can be implemented in any suitable manner. For example, in some embodiments, one or more of the transmission lines can be implemented as C-L-C pi-type lumped sections. In some other embodiments, they may be implemented as truly distributed transmission lines.

The passive mixers can be driven by signals as shown in FIG. 3, in some embodiments. For example, in some embodiments, mixer 314 can be driven by a signal $\cos(\omega_m t)$, mixer 316 can be driven by a signal $\cos(\omega_m t+\Phi)$, mixer 318 can be driven by a signal $\sin(\omega_m t)$, and mixer 320 can be driven by a signal $\sin(\omega_m t+\Phi)$, where $\Phi$ is 90° for $T_d=\frac{1}{4}(\omega_m/2\pi)$.

Figure 4A:
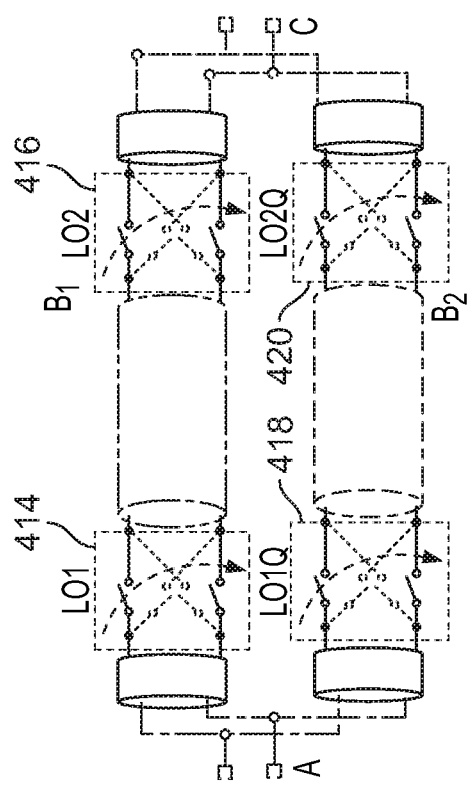
FIGS. 4A, 4B, and 4C is an example of the operation of switch groups in accordance with some embodiments.
Figure 4C:
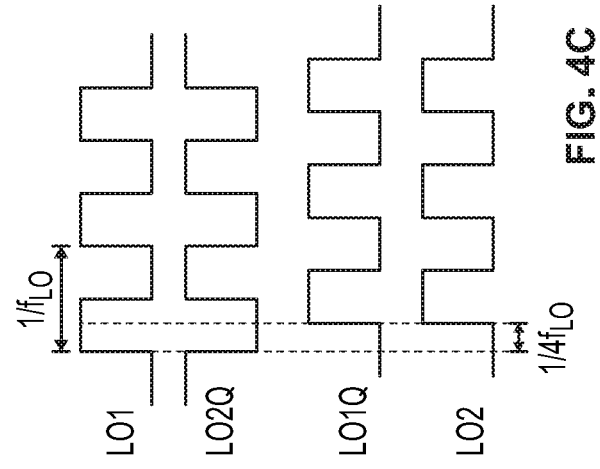
Figure 4B:
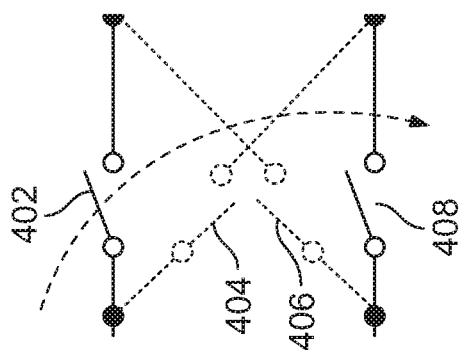

In some embodiments, mixers 314, 316, 318, and 320 shown in FIG. 3 can be implemented with switch groups 414, 416, 418, and 420, respectively, as illustrated in FIG. 4A. As shown in FIG. 4B, the switch groups in FIG. 4A can each include four switches 402, 404, 406, and 408, in some embodiments.

The switches in the switch groups can be implemented in any suitable manner. For example, in some embodiments, the switches can be implemented using NMOS transistors, PMOS transistors, both NMOS and PMOS transistors, or any other suitable transistor or any other switch technology.

Switch groups 414, 416, 418, and 420 can be controlled by local oscillator signals LO1, LO2, LO1Q, and LO2Q, respectively, as shown in FIG. 4A, in some embodiments. A timing diagram showing an example of these signals with respect to each other is shown in FIG. 4C. In this diagram, $f_{LO}$ is equal to $\omega_{in}/2\pi$. When a local oscillator (e.g., LO1, LO2, LO1Q, or LO2Q) is HIGH, switches 402 and 408 in the corresponding switch group are CLOSED and switches 404 and 406 in the corresponding switch group are OPEN. When a local oscillator (e.g., LO1, LO2, LO1Q, or LO2Q) is LOW, switches 404 and 406 in the corresponding switch group are OPEN and switches 404 and 406 in the corresponding switch group are CLOSED.

Figure 5:
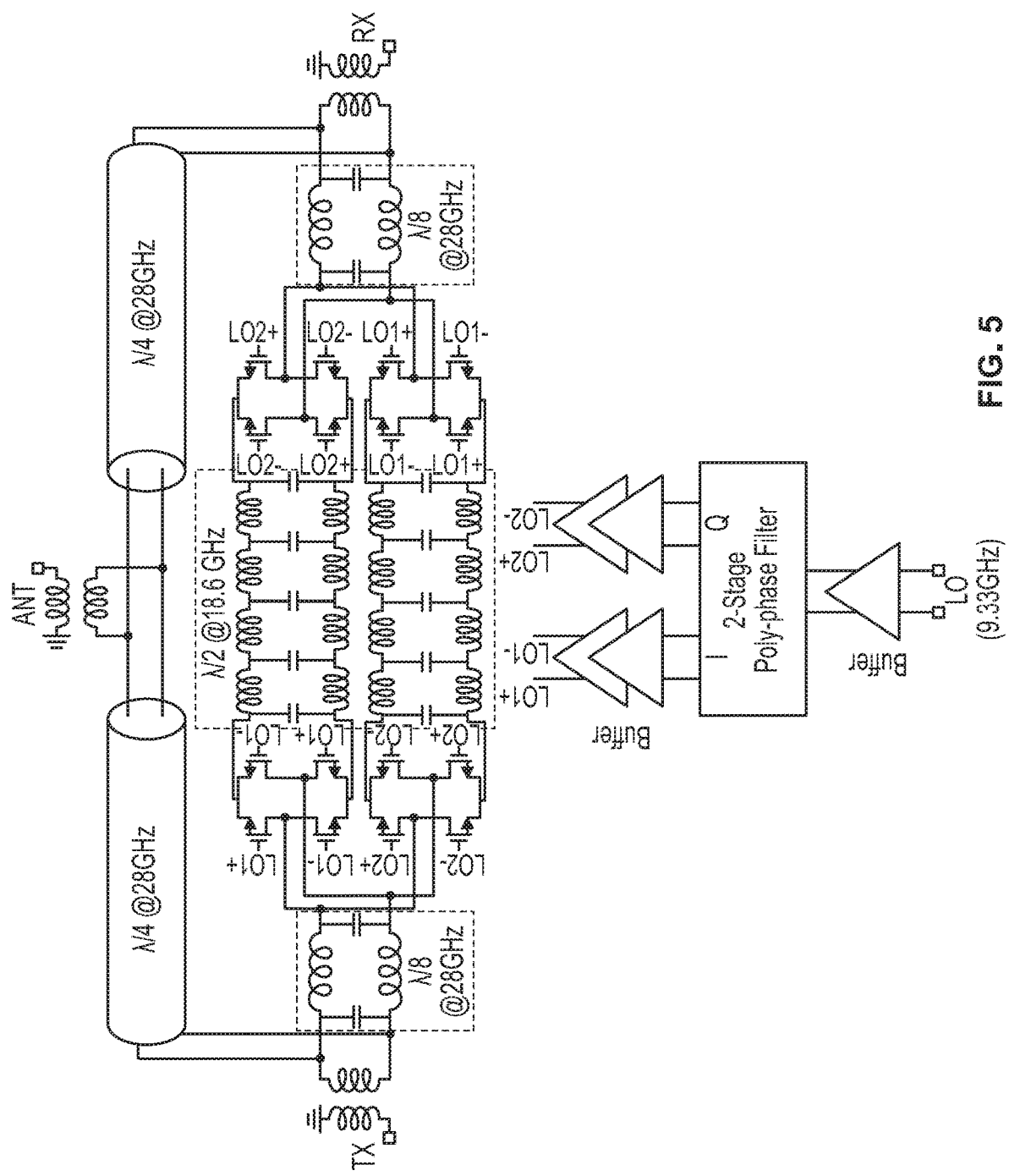
FIG. 5 is an example of a schematic of a circulator in accordance with some embodiments.

Turning to FIG. 5, an example of a schematic of a circulator that can be implemented in accordance with some embodiments is shown. This circulator is generally in the same architecture as shown in FIG. 3, except that transmission line 308 is split in half and part is placed adjacent to the receiver nodes.

The differential nature of the circulator can reduce the LO feedthrough and improve power handling. The fully-balanced I/Q quads can be designed using 2×16 μm/40 nm floating-body transistors. The placement of the gyrator in a symmetric fashion between the TX and RX ports can be used to enable switch parasitics to be absorbed into the lumped capacitance of the $\lambda/8$ sections on either side. Artificial (quasi-distributed) transmission lines with inductor Q of 20 can be used in the gyrator, using four stages of lumped it-type C-L-C sections with a Bragg frequency of 83.9 GHz. The ¼ transmission lines between the TX and ANT and ANT and RX ports can be implemented using differential conductor-backed coplanar waveguides. As shown, baluns can be included at the TX, ANT and RX ports to enable single-ended measurements, and separate test structures can be included to de-embed the response of the baluns.

Figure 6:
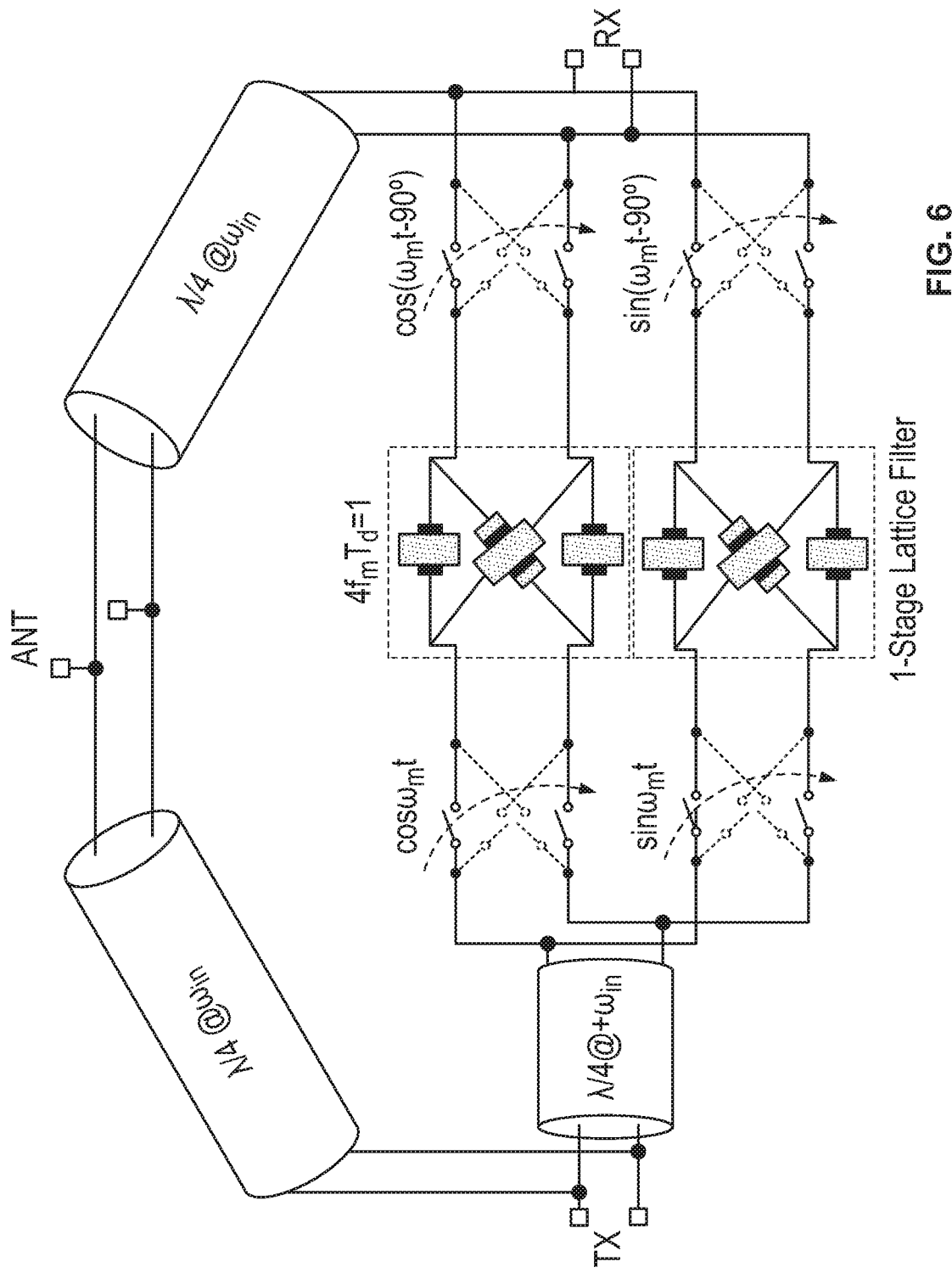
FIG. 6 is an example of a schematic of a circulator including a 1-stage lattice filter in accordance with some embodiments.

Turning to FIG. 6, an example of the architecture of FIG. 3 using 1-stage lattice filters instead of transmission lines 322 and 324 (FIG. 3) is shown. Any suitable filters can be used. For example, in some embodiments, film bulk acoustic resonator (FBAR) filters, surface acoustic wave (SAW) filters, bulk acoustic wave (BAW) filters, and/or any other suitable filters can be used. By implementing large delays using SAW or BAW filters, the clock frequency can be even further reduced. This can be exploited to design even-higher-linearity circulators through the use of high-voltage technologies and high-linearity switch design techniques.

The circuits described herein can be implemented in any suitable technology in some embodiments. For example, in some embodiments, these circuits can be implemented in any semiconductor technology such as silicon, Gallium Nitride (GaN), Indium phosphide (InP), Gallium arsenide (GaAs), etc. More particularly, for example, in some embodiments, the circuits can be implemented in IBM 45 nm SOI CMOS process.

In FIG. 1, the phase shift provided by the non-reciprocal phase component, $\Phi-\Phi_1$, can be tuned by changing the clock phase, $\Phi$. The frequency at which TX-to-RX isolation is achieved depends on $\Phi-\Phi_1$, so by tuning $\Phi$, we can tune the isolation frequency.

Figure 7:
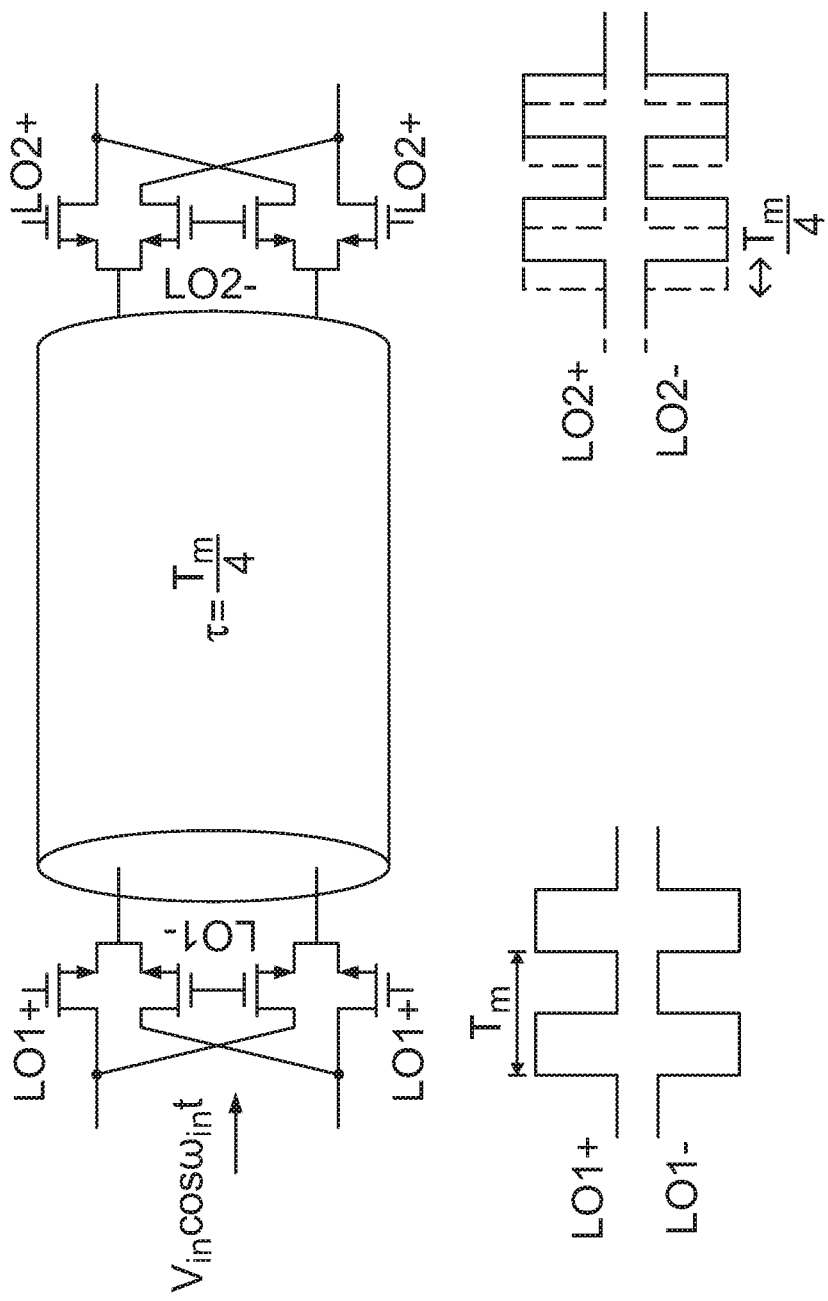
FIG. 7 is an example of schematic of a non-reciprocal circuit element in accordance with some embodiments.

Turning to FIG. 7, another example of some embodiments is shown. As illustrated, a spatio-temporal conductivity modulation concept in accordance with some embodiments can include two sets of switches implemented in a fully-balanced fashion on either end of a differential transmission line delay. The switches can be modulated between short and open circuit states through periodic square pulses with a 50% duty cycle. As shown, the transmission line provides a delay equal to one quarter of the modulation period ($T_m/4$), and the modulation of the right switches is delayed with respect to those on the left by the same amount ($T_m/4$). Adding this delay between the two sets of switches allows incident signals from different directions to follow different paths, breaking reciprocity.

FIGS. 8A, 8B, and 8C depict an example of signal propagation in the forward direction (from left, or port 1, to right, or port 2) in accordance with some embodiments. As shown in FIG. 8A, during the first half-period of the modulation clock, when LO1+ is high, the incident signal goes into the transmission line, gets delayed by the transmission line delay of $T_m/4$, and reaches to the second set of switches. At this instant, LO2+ is high, so that the signal directly passes to the output. A similar explanation holds also for the second half-period of the modulation clock (shown in FIG. 8B): the signal goes into the transmission line with a sign flip, gets delayed by $T_m/4$, and the sign flip is recovered by the second set of switches. In other words, signals traveling in the forward direction experience no polarity inversion in the first half cycle, and two polarity inversions that negate each other occur in the second half cycle. Thus, effectively, in the forward direction, signals pass through the structure without any loss and experience a delay of one quarter of the modulation period. This can be described by the time domain equation:

$$v_2^- = v_1^+\left(t - \frac{T_m}{4}\right)$$

where $v_1^+$ and $v_2^-$ are the incident and transmitted signals at ports 1 and 2, respectively.

Alternatively, this structure can be modeled by multiplication, delay and multiplication as depicted in FIG. 8C. Here, fully-balanced switching operation is modeled as multiplication by a 50% duty cycle clock, m(t), flipping between +1 and −1. Thus the output signal can be written as:

$$v_2^-(t) = v_1^+\left(t - \frac{T_m}{4}\right)m\left(m - \frac{T_m}{4}\right)m\left(t - \frac{T_m}{4}\right) = v_1^+\left(t - \frac{T_m}{4}\right) \quad (1)$$

which takes advantage of the fact that $$m\left(t - \frac{T_m}{4}\right)m\left(t - \frac{T_m}{4}\right) = +1$$

for a binary (−1, +1) signal.

Figures 9A, 9B:
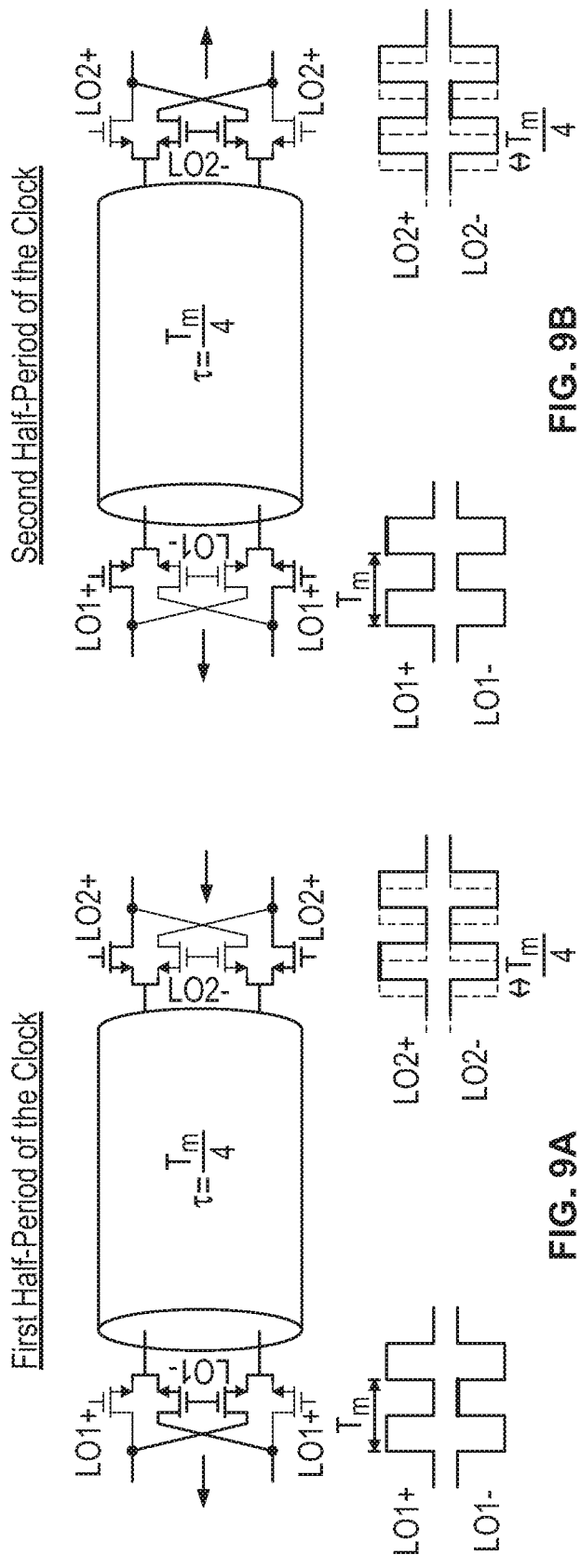
FIGS. 9A, 9B, and 9C are examples of the operation of the element of FIG. 7 with a signal propagating from right to left in accordance with some embodiments.
Figure 9C:
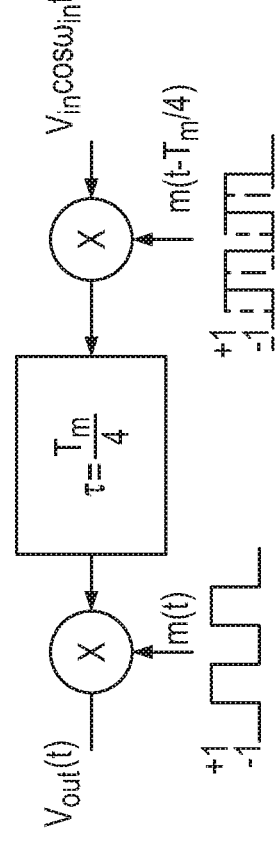

The signal propagation in the backward direction (from right to left) is shown in FIGS. 9A, 9B, and 9C. As shown in FIG. 9A, during the first half-period of the modulation clock, when LO2+ is high, the signal goes into the transmission line and gets delayed by $T_m/4$, and the second set of switches flips the signal sign. Similarly, during the second half-period of the modulation clock (LO2− is high), the signal goes into the transmission line with a sign flip, gets delayed by $T_m/4$ and reaches the output as LO1+ is high. In brief, signals traveling from right to left experience a transmission line delay of $T_m/4$ and a polarity inversion in both half cycles. This can be described by:

$$v_1^-(t) = -v_2^+\left(t - \frac{T_m}{4}\right)$$

where $v_2^+$ and $v_1^-$ are the incident and transmitted signals at ports 1 and 2, respectively.

An analysis based on the signal flow diagram in FIG. 9C gives $$v_1^-(t) = v_2^+\left(t - \frac{T_m}{4}\right)m\left(t - \frac{T_m}{2}\right)m(t) = -v_2^+\left(t - \frac{T_m}{4}\right) \quad (2)$$

which takes advantage of $m(t-T_m/2)m(t)=-1$ for a binary (−1, +1) 50% duty-cycle signal.

From (1) and (2), the resultant S-parameters can be written as $$S_{21}(\omega_{in}) = e^{-j\frac{\pi}{2}\left(\frac{\omega_{in}}{\omega_m}\right)} \quad (3)$$

$$S_{12}(\omega_{in}) = -e^{-j\frac{\pi}{2}\left(\frac{\omega_{in}}{\omega_m}\right)} \quad (4)$$

where $\omega_{in}$ and $\omega_m$ are the signal and modulation frequencies, respectively. It should be noted $S_{11}=S_{22}=0$ since there is a pair of switches which connects the transmission line to the input and output at any instant in both half cycles. As can be seen from (3) and (4), this generalized spatio-temporal conductivity modulation technique is ideally lossless and breaks phase reciprocity over a theoretically infinite bandwidth. More importantly, it operates as an ideal passive lossless gyrator—a basic non-reciprocal component that provides a non-reciprocal phase difference of it and can be used as a building block to construct arbitrarily complex non-reciprocal networks—over theoretically infinite bandwidth. In practice, the insertion loss would be limited by ohmic losses in the switches and transmission line, and bandwidth by dispersion effects in the transmission line, particularly if it is implemented in a quasi-distributed fashion to absorb the capacitive parasitics of the switches.

Figure 10:
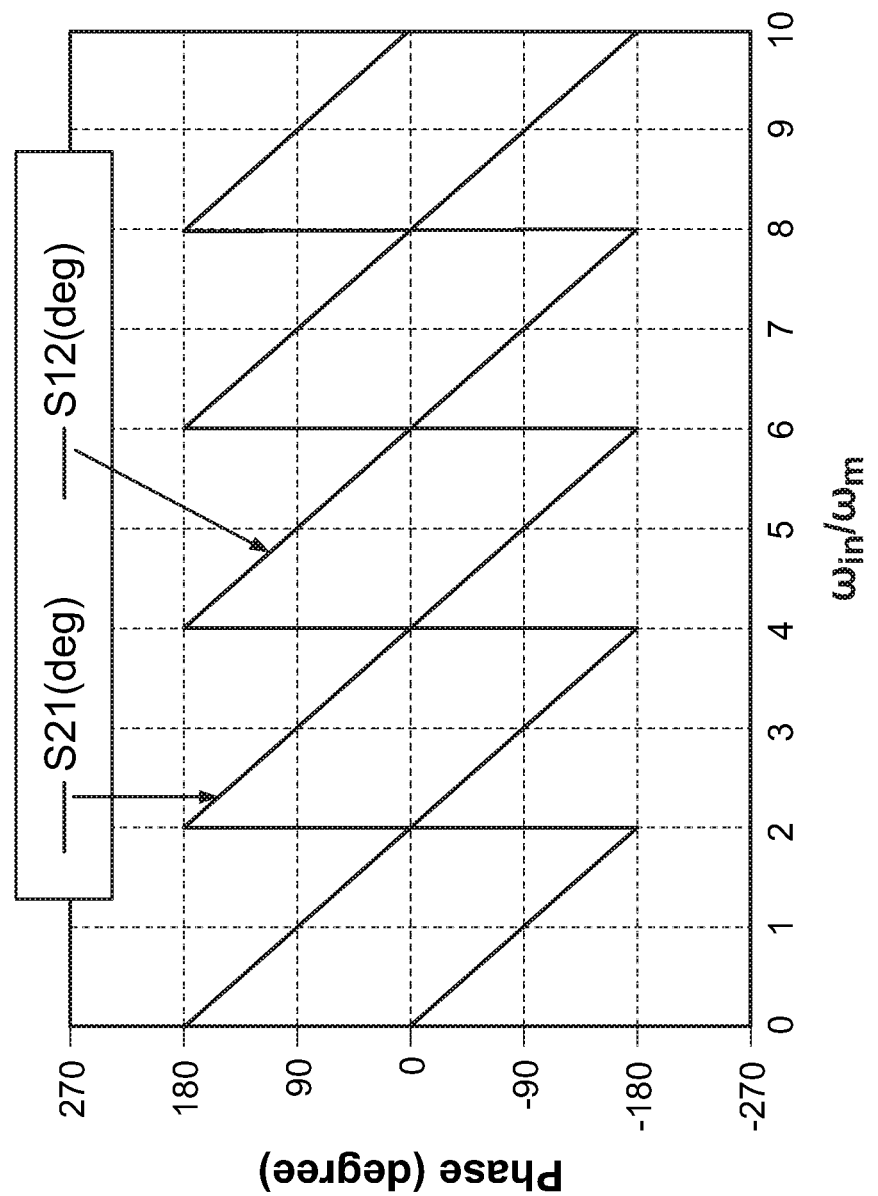
FIG. 10 is an example illustration of forward and reverse insertion phases across frequency normalized to a modulation clock frequency in accordance with some embodiments.

FIG. 10 shows an example of an illustration of forward and reverse insertion phases (∠S21 and ∠S12, respectively) across frequency normalized to the modulation clock frequency. As can be seen, the spatio-temporal conductivity modulation provides a phase shift of +/−90 degrees at the odd multiples of the modulation frequency, namely $\omega_{in}=(2n-1)\omega_m$, where n is a positive integer. Using higher odd multiples reduces the clock frequency, which eases clock generation and distribution, at the expense of a longer transmission line which introduces more loss and larger form factor. In some embodiments, an operating to modulation frequency ratio of 3 ($\omega_m=\omega_{in}/3=8.33$ GHz) can be used to optimize this trade-off.

Figure 11:
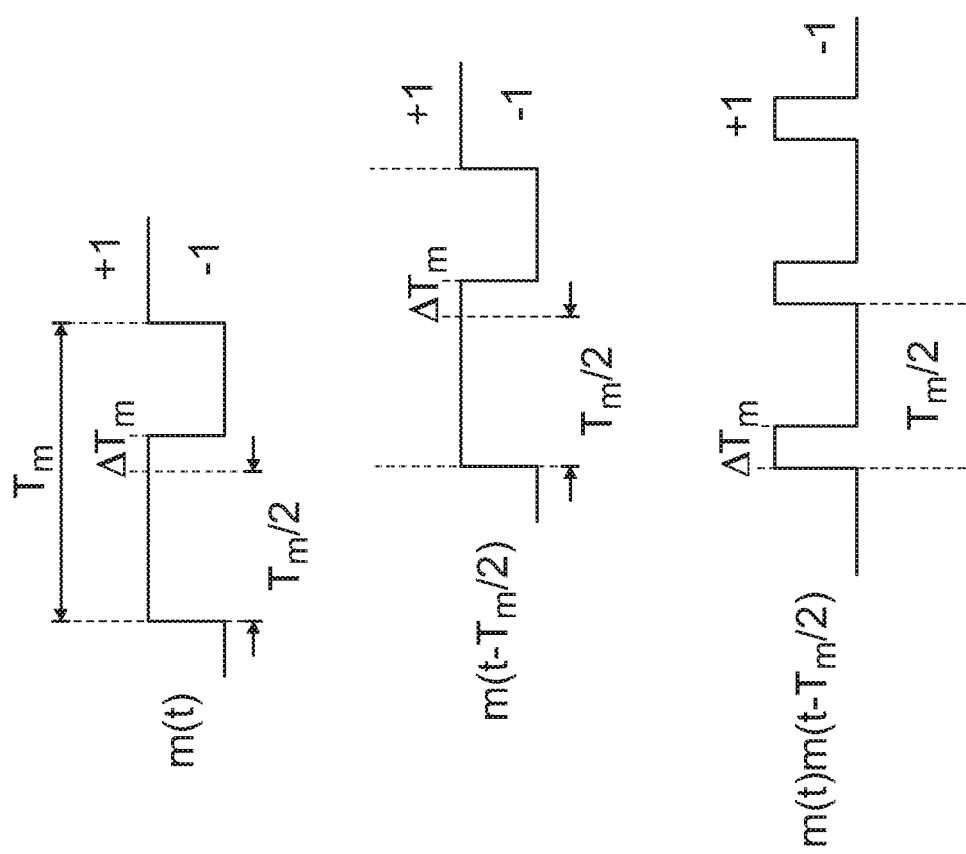
FIG. 11 is an example illustration of adverse effects on the operation of a non-reciprocal circuit element when operating with a non-50% duty cycle local oscillator in accordance with some embodiments.

In some embodiments, duty cycle impairment in the modulation clock can have an adverse effect on operation in the reverse direction. For example, let us assume a deviation from ideal 50% duty cycle by $\Delta T_m$. The forward direction remains unaffected, since $m(t-T_m/4)m(t-T_m/4)$ continues to be +1, but in the reverse direction, $m(t-T_m/2)m(t)$ will give a pulse train with a pulse width of $\Delta T$ and period of $T_m/2$ as depicted in FIG. 11. Thus, deviation from 50% duty cycle would result in loss in the reverse direction, as some portion of the power would be transferred to mixing frequencies due to the $2\omega_m$ content in $m(t-T_m/2)m(t)$. $S_{12}$ at the operating frequency becomes $$S_{12}(\omega_{in}) = \left(-1 + \frac{4\Delta T_m}{T_m}\right)e^{-j\frac{\pi}{2}\left(\frac{\omega_{in}}{\omega_m}\right)} \quad (5)$$

Figure 12A:
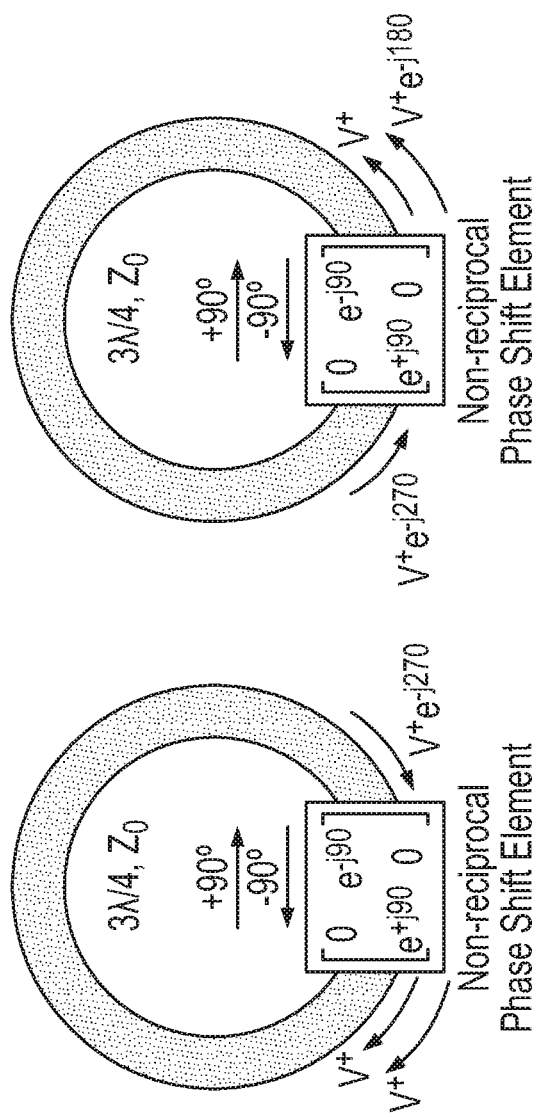
FIG. 12A is an example of a block diagram of a non-reciprocal circulator in accordance with some embodiments.

As shown in FIG. 12A, a non-reciprocal phase shift element (gyrator) can be embedded within a 3λ/4 transmission line ring to realize a non-reciprocal circulator in accordance with some embodiments. In the clockwise direction, the −270 degree phase shift of the transmission line adds to the −90 degree phase shift through the gyrator, enabling wave propagation. In the counter-clockwise direction, the −270 degree phase shift of the transmission line adds to the +90 degree phase shift of the gyrator, suppressing wave propagation.

Figure 12B:
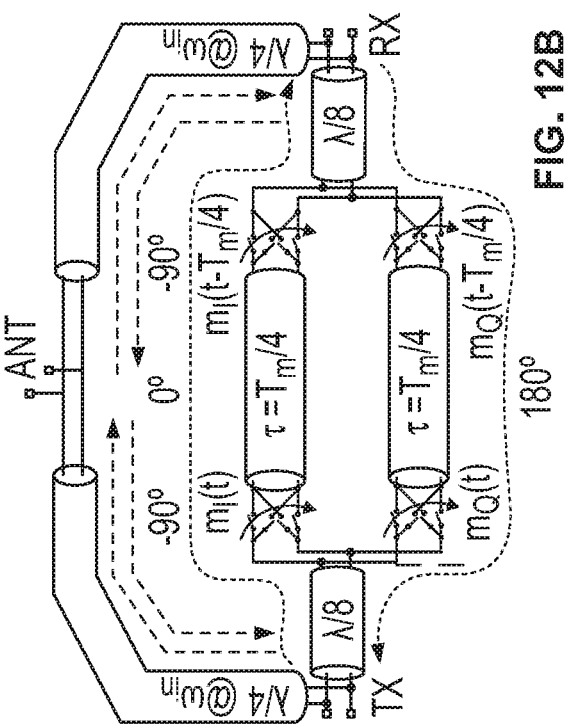
FIG. 12B is an example of a block diagram of a three port non-reciprocal circulator in accordance with some embodiments.

A three-port circulator can be realized in some embodiments by introducing three ports λ/4 apart from each other as shown in FIG. 12B. The gyrator can placed symmetrically between the TX and RX ports in some embodiments. The S-parameters of the circulator at $\omega_{in}=3\omega_m$ can be derived to be:

$$S = \begin{pmatrix} 0 & 0 & -1 \\ -j & 0 & 0 \\ 0 & -j & 0 \end{pmatrix} \quad (6)$$

where TX is port 1, ANT is port 2, and RX is port 3.

Figure 13:
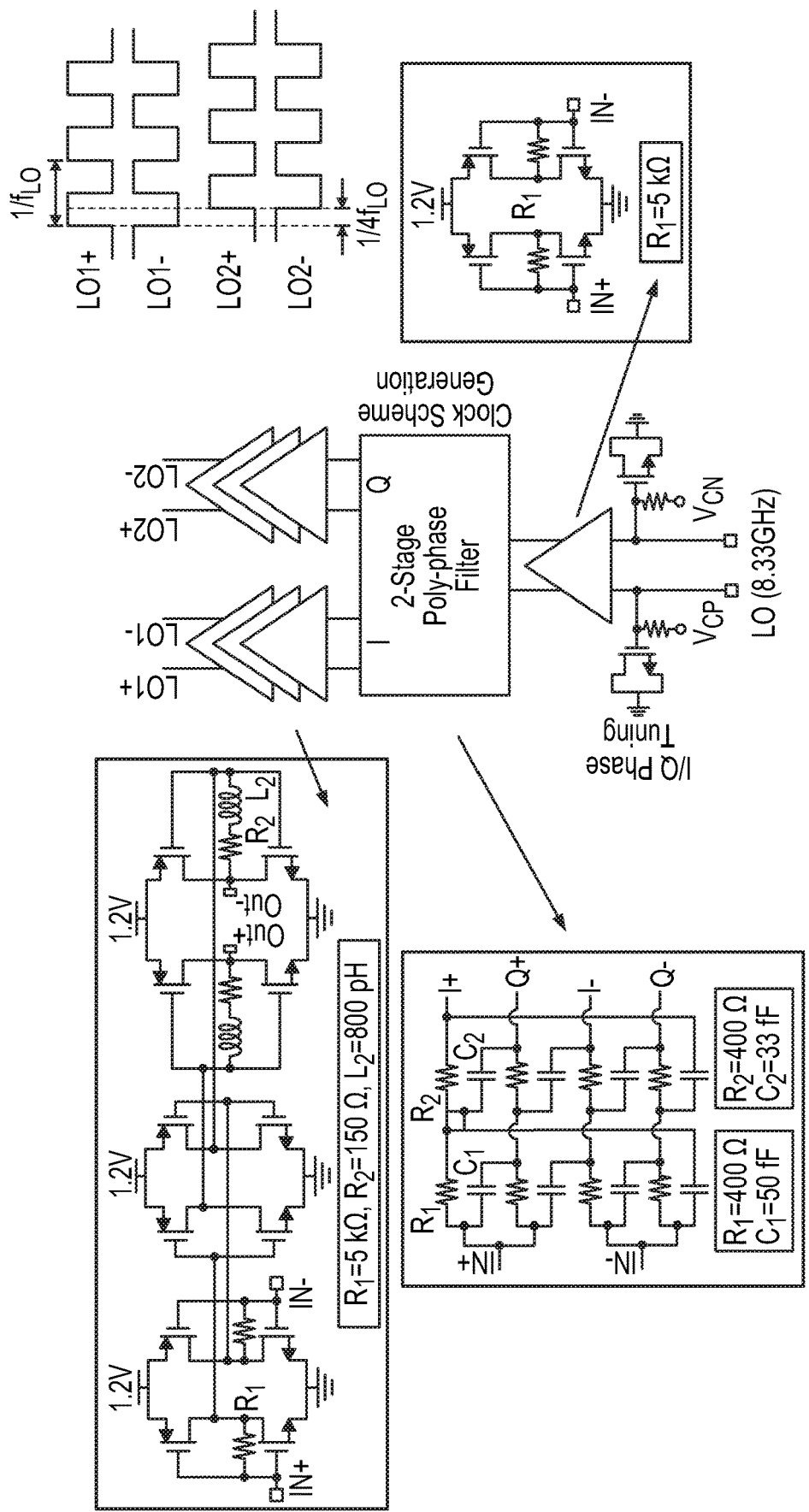
FIG. 13 is an example of a block diagram and circuit diagrams of a local oscillator path in accordance with some embodiments.

FIG. 13 shows an example of a block diagram and circuit diagrams of an 8.33 GHz LO path in accordance with some embodiments. As illustrated, the four quadrature clock signals driving the switches can be generated from two input differential sinusoidal signals at 8.33 GHz. A two-stage poly-phase filter (phase imbalance <2 degrees for up to 15% variation in R and C values) can be used to generate the 8.33 GHz quadrature signals with 0/90/180/270 degree phase relationship. After the poly-phase filter, a three stage self-biased CMOS buffer chain with inductive peaking in the final stage can be used to generate the square wave clock signals for the switches. Independently controlled NMOS varactors (implemented using 4×40 µm/40 nm floating-body devices) are placed at the differential LO inputs to compensate for I/Q imbalance of the poly-phase filter. This provides an I/Q calibration range of +/−10 degrees that can be used optimize the circulator performance.

Figure 14:
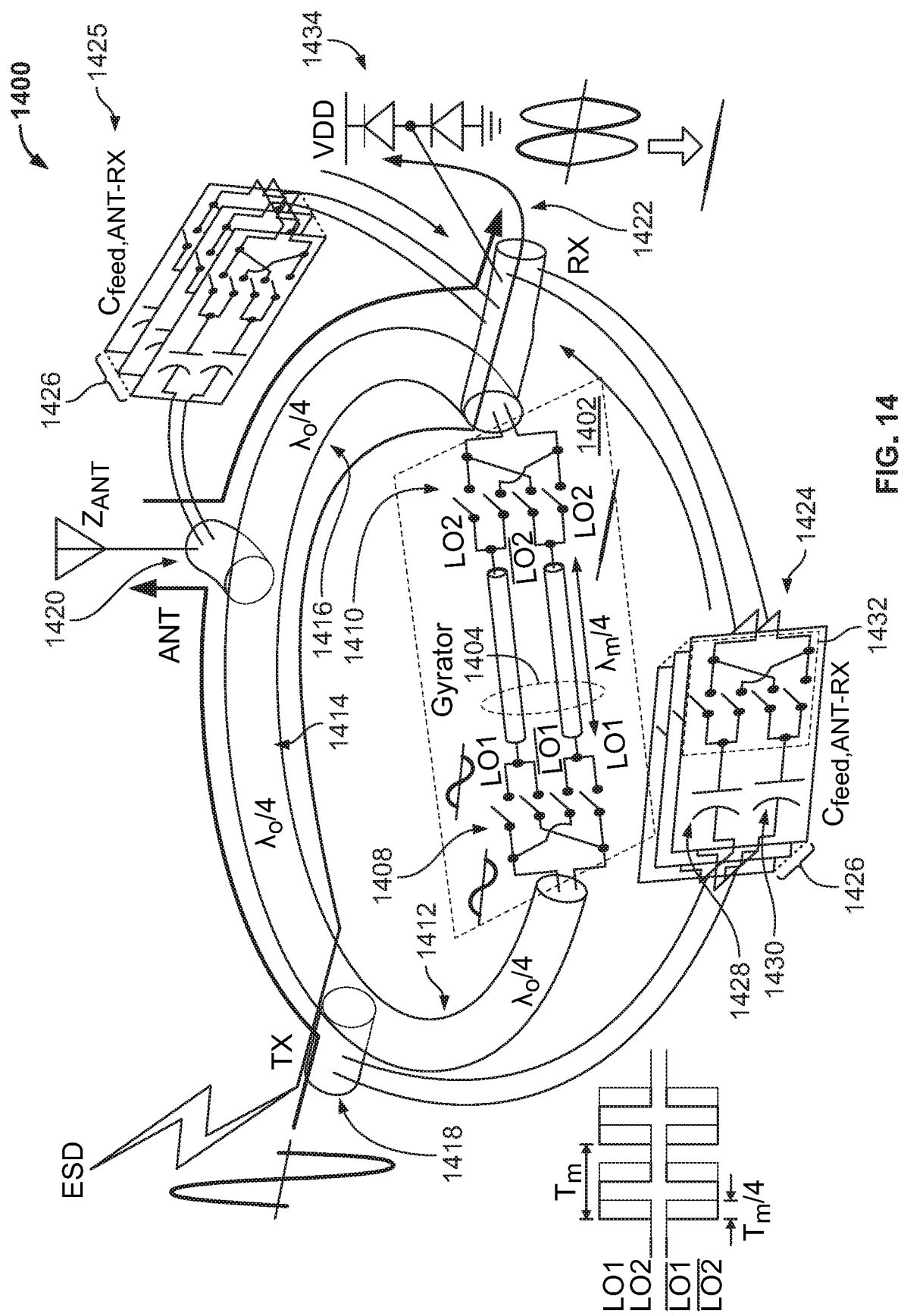
FIG. 14 is an example of an architecture for a circulator including cancellation paths and electrostatic discharge diodes in accordance with some embodiments.
Figure 15:
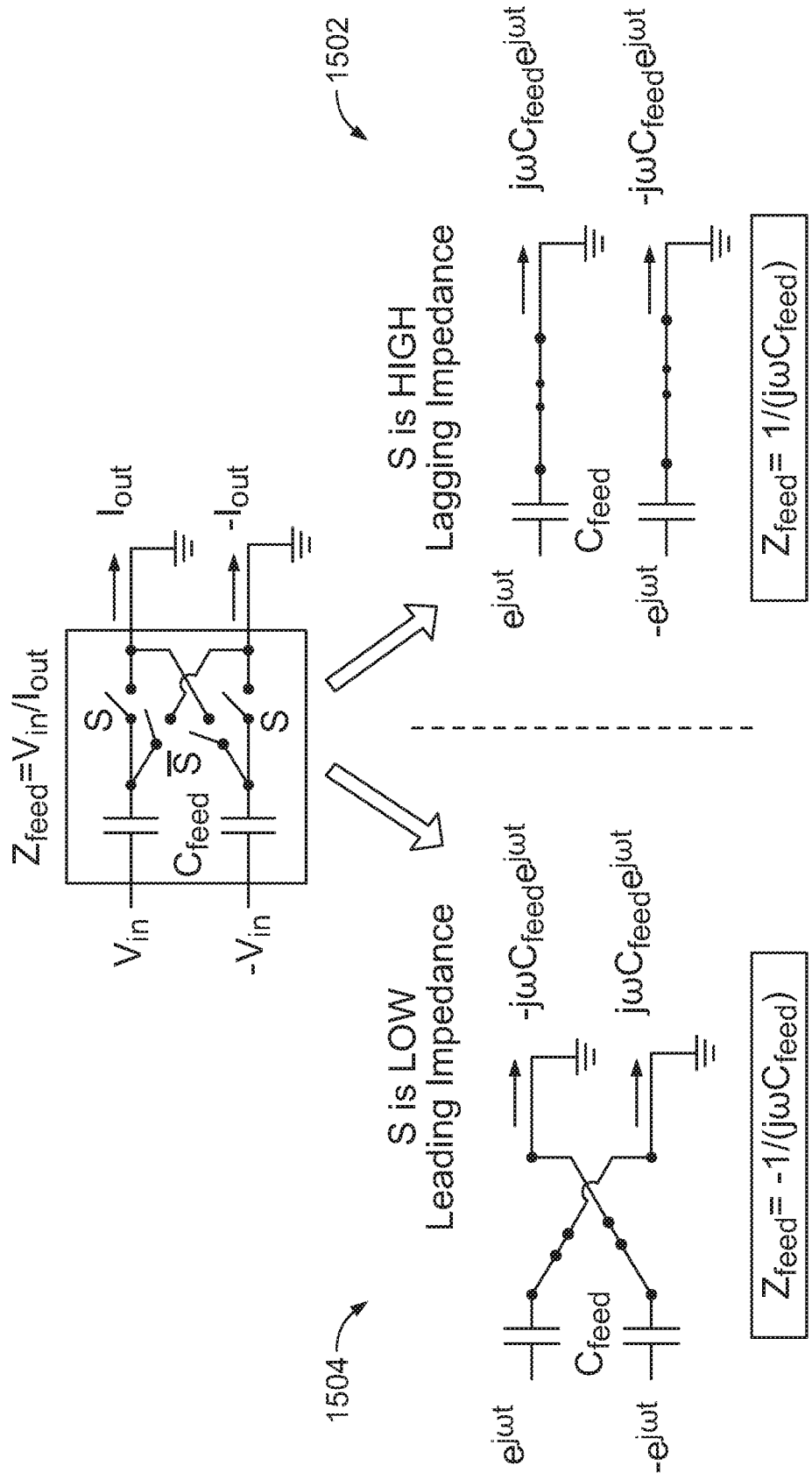
FIG. 15 is an example of a block diagram illustrating direct connections and crisscross connections in accordance with some embodiments.

Turning to FIG. 14, an example 1400 of an architecture for a circulator in accordance with some embodiments is shown. As illustrated, architecture 1400 includes a gyrator 1402, transmission line sections 1412, 1414, and 1416, TX port 1418, ANT port 1420, RX port 1422, cancellation paths 1424 and 1425, and electrostatic discharge (ESD) diodes 1434. Any other suitable components can be included in circulator 1400, such as components described below in connection with FIGS. 14-17 and 19-20.

As shown in FIG. 14, gyrator 1402 can include a differential transmission line 1404 positioned between doubly balanced switch sets (which can be referred to as doubly balanced passive mixers) 1408 and 1410 in some embodiments. The passive mixers can be switched at a switching frequency equal to one-third of the operating frequency with 50% duty cycle and a 90-degree phase difference between the clocks switch mixers 1408 and 1410 (i.e., LO1 and $\overline{LO1}$ for mixer 1408, and LO2 and $\overline{LO2}$ for mixer 1410), in some embodiments. The differential transmission line can be quarter-wave ($\lambda/4$) at the switching frequency in some embodiments. In this configuration, a signal traveling from left to right experiences the delay of the transmission line, while a signal traveling from right to left experiences the delay of the line along with an additional sign-flip. The additional sign-flip in the reverse direction creates a non-reciprocal phase response of 180 degrees, making this structure a gyrator. Ideal y, the gyrator would exhibit perfect input matching, no insertion loss, and a non-reciprocal phase difference of 180 degrees across a theoretically infinite bandwidth. Although the gyrator is externally linear time-invariant (LTI), i.e., no mixing products are seen at the ports, the transmission line in the gyrator should be configured to have sufficient bandwidth to support all the mixing products created after the first mixer.

At signal frequencies which are alternate odd multiples of the switching frequency ($\omega_s$) of the form $(4n-1)\omega_s$, the gyrator exhibits a +/−90-degree phase shift in forward/reverse directions, respectively. At frequencies of the form $(4n+1)\omega_s$, the gyrator exhibits a +/−90-degree phase shift in reverse/forward directions, respectively. This +/−90-degree phase shift creates a non-reciprocal ring with different transmission responses for clockwise and counterclockwise modes, Due to the −270-degree phase shift from the ring and −90-degree phase shift from the gyrator, wave propagation is supported in the clockwise direction. In the counterclockwise direction, however, the −270-degree phase shift from the transmission line and +90-degree phase shift from the gyrator result in a net phase shift of −180 degrees and suppression of the counterclockwise mode.

As shown in FIG. 14, transmission line section 1412 is $\lambda/4$ in length and positioned between the left side of gyrator 1402 and TX port 1418. Transmission line section 1414 is also 214 in length and positioned between TX port 1418 and ANT port 1420. Transmission line section 1416 is also $\lambda/4$ in length and positioned between ANT port 1420 and RX port 1422. The right side of gyrator 1402 is also connected to the side of transmission line section 1416 connected to RX port 1422.

Since the gyrator is externally LTI, the $3\lambda/4$ ring around the gyrator (formed by transmission line sections 1412, 1414, and 1416) needs only to support the signal bandwidth, and hence, it can be designed to have a smaller bandwidth when compared to the transmission line in the gyrator.

The S-parameters of the circulator formed by gyrator 1402 and transmission line sections 1412, 1414, and 1416 can be calculated to be as shown in (6) above.

While the ports can be placed anywhere on the transmission line by maintaining the $\lambda/4$ separation, the placement of the RX port next to gyrator protects the modulating switches from the TX swing due to the inherent TX-RX isolation of the circulator in some embodiments. This technique greatly enhances the linearity and power handling at the TX port in some embodiments.

The gyrator architecture utilized here enables clocking at any odd sub-harmonic of the operating frequency, with the tradeoff that excessive lowering of the dock frequency requires a longer transmission line within the gyrator, thus increasing losses. In some embodiments, this feature can be exploited to enhance linearity and power handling, by using 333-MHz clocking for 1-GHz operation and using the thick-oxide transistors in a 180-nm SOI CMOS technology as the gyrator switches.

In some embodiments, leakage at RX port 1422 created by an impedance mismatch at ANT port 1420 can be nulled by cancellation paths 1424 and 1425 from TX port 1418 to RX port 1422 and from ANT port 1420 to RX port 1422, respectively, as shown in FIG. 14. In some embodiments, in order to cancel arbitrary ANT mismatches across the VSWR circle, both in-phase and quadrature-phase cancellation signals can be used as illustrated in FIG. 14.

As shown in FIG. 14, cancellation paths 1424 and 1425 can be formed by multiple banks 1426 of switch-connected capacitors $C_{feed,TX-RX}$ and $C_{feed,ANT-RX}$, respectively. As illustrated in path 1424, each bank 1426 of paths 1424 and 1425 can include one or more capacitor 1428 for the in-phase and one or more capacitor 1430 for the quadrature phase signal, and a switch network 1432 that can allow the capacitors to be either direct-connected or crisscross-connected on the in-phase and quadrature phase signals as shown by 1502 and 1504, respectively, of FIG. 15. The crisscross connection 1504 creates a feed impedance with a lead phase response, enabling complete coverage of the complex plane without inductors.

Cancellation path 1424 injects a current that is 90 degrees out of phase with the TX voltage due to its reactive nature, and is programmable in magnitude. Connection path 1425 introduces an orthogonal current to the one in path 1424 since the voltage at the ANT port is 90 degrees out of phase with respect to the TX voltage. A differential circulator implementation enables sign inversion in each of these paths, and therefore complete coverage of the complex plane is enabled without inductors and resistors (i.e., additional loss).

Figure 16:
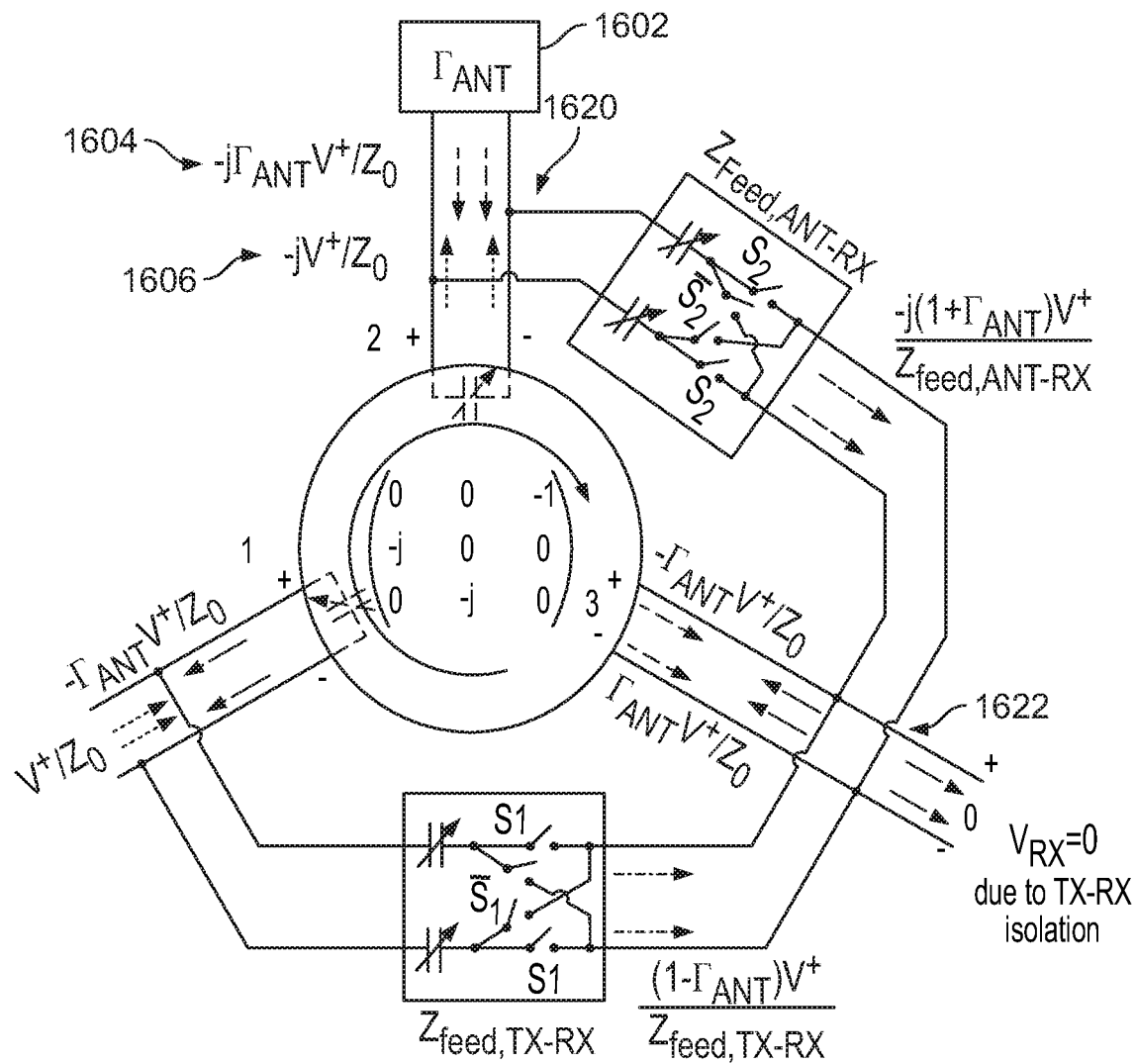
FIG. 16 is an example of a block diagram of a circulator showing reflections caused by an antenna port impedance mismatch in accordance with some embodiments.

FIG. 16 shows an example of antenna balancing for an ideal circulator whose S-parameters are given in (6). When the ideal circulator is terminated with an antenna of reflection coefficient ΓANT 1602, some part $(-j\Gamma_{ANT}V^+/Z_O)$ 1604 of TX signal $(-jV^+/Z_O)$ 1606 is reflected back at the ANT port 1620 and gets transmitted to the RX port 1622. The values of feed impedances compensating $\Gamma_{ANT}$ can be calculated as $$Z_{feed,TX-RX} = \frac{-jZ_o}{2}\left(\frac{1-|\Gamma_{ANT}|^2}{imag(\Gamma_{ANT})}\right), \tag{7}$$

$$Z_{feed,ANT-RX} = \frac{-jZ_o}{2}\left(\frac{1-|\Gamma_{ANT}|^2}{re(\Gamma_{ANT})-|\Gamma_{ANT}|^2}\right). \tag{8}$$

Along with the coverage for the antenna variations, the notch in TX-RX isolation can also be varied across frequency by choosing an appropriate value for the feed impedances.

Figure 17:
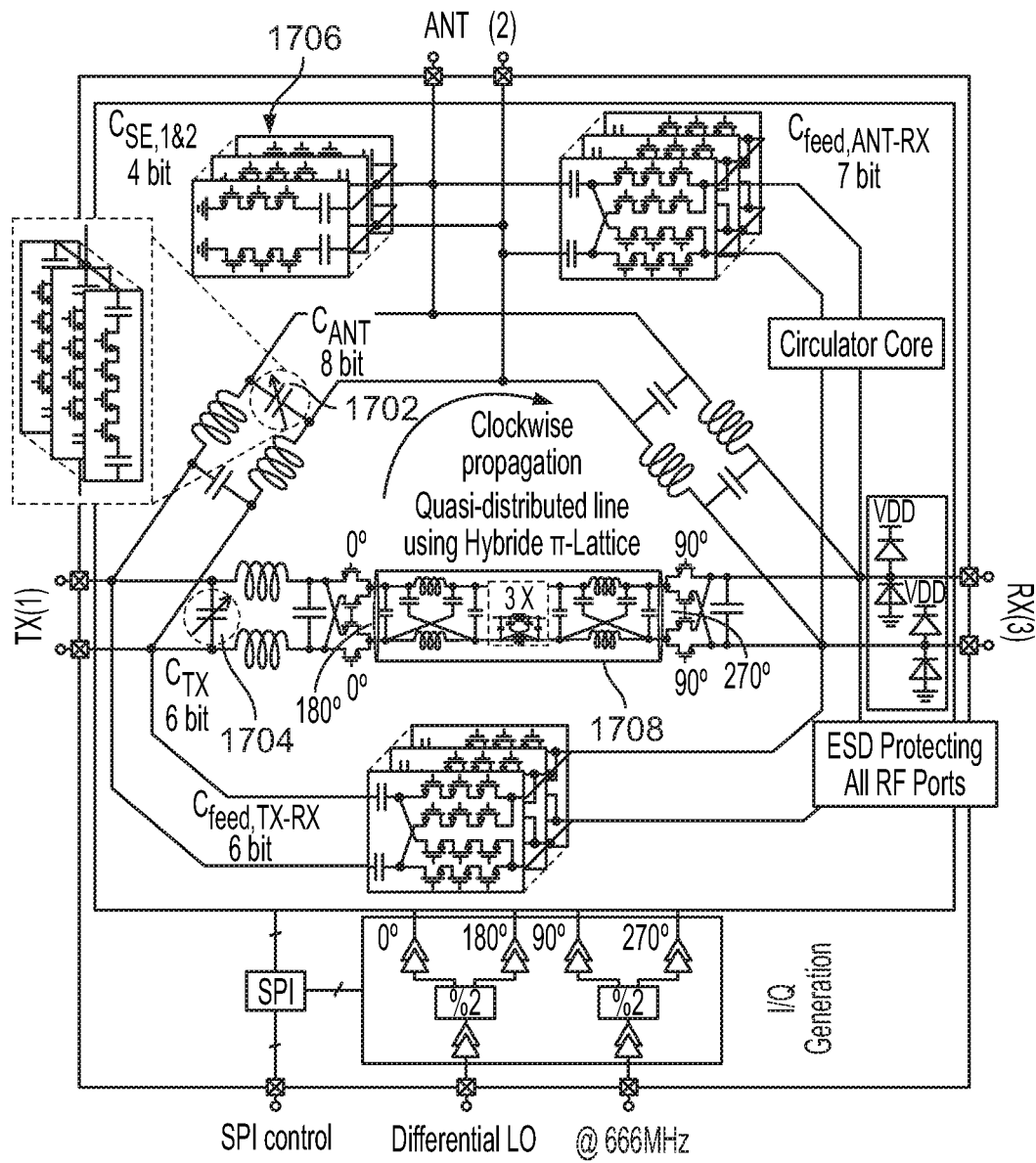
FIG. 17 is an example of a detailed schematic of a circulator in accordance with some embodiments.

The loading of the feed capacitors on the TX and ANT ports changes $\Gamma_{ANT}$, and, hence, TX-to-RX leakage, making the tuning for isolation a 2-D problem and increasing the time of search for finding the optimum setting for maximum TX-RX isolation. To compensate, differential tunable capacitors $C_{ANT}$ 1702 and $C_{TX}$ 1704 can be implemented at both the TX and ANT ports, as shown in FIG. 17. In a differential implementation, $C_{ANT}$ can be changed from its initial value by $\Delta C_{ANT}=-0.5C_{feed,ANT-RX}$, and $C_{TX}$ can be changed from its initial value by $\Delta C_{TX}=-0.5C_{feed,TX-RX}$.

$C_{ANT}$ can also be used to compensate for the imaginary part of $\Gamma_{ANT}$ similar to $C_{feed,TX-RX}$. Hence, by using the tunability of $C_{ANT}$ on top of the feed capacitors ($C_{feed,TX-RX}$), the VSWR coverage of the balancing network can be increased even further or the tuning range of the feed capacitors can be reduced while achieving the same VSWR coverage. For instance, by using CA-NT along with the feed capacitors ($C_{feed,TX-RX}$), the tuning range of $C_{feed,TX-RX}$ can be eliminated completely in an ideal circulator, while achieving the same VSWR coverage. In some embodiments, due to the presence of circulator non-idealities, $C_{feed,TX-RX}$ can be reduced by a factor of 2.

When an ideal circulator is terminated with an antenna with reflection coefficient of FANT [antenna impedance $Z_{ANT}=Z_O((1+\Gamma_{ANT})/(1-\Gamma_{ANT}))$], $\Delta C_{ANT}$ can be chosen such that it transforms $Z_{ANT}$ to a real impedance $Z'_{ANT}$ with a corresponding reflection $\Gamma'_{ANT}$, as expressed in $$\Delta C_{ANT} = \frac{-imag(1/Z_{ANT})}{\omega}, \tag{9}$$

$$Z'_{ANT} = \frac{1}{re(1/Z_{ANT})}, \tag{10}$$

$$\Gamma'_{ANT} = \left(\frac{Z'_{ANT}-Z_o}{Z'_{ANT}+Z_o}\right). \tag{11}$$

The leakage from this real reflection coefficient can be compensated using $C_{feed,TX-RX}$ from (8) and modifying $C_{ANT}$ for loading of $C_{feed,ANT-RX}$. The corresponding $Z_{feed,ANT-RX}$ and $\Delta C_{ANT}$ are given by:

$$Z_{feed,ANT-RX} = \frac{-jZ_o}{2}\left(\frac{1+\Gamma'_{ANT}}{\Gamma'_{ANT}}\right), \tag{12}$$

$$\Delta C_{ANT} = \frac{-imag(1/Z_{ANT})}{\omega} - 0.5C_{feed,ANT-RX}. \tag{13}$$

Transmission losses of an ideal circulator tuned to maximum isolation using $C_{ANT}$ and $C_{feed,ANT-RX}$ are presented in (14) and (15) below.

$$|S_{21}| = \left|\sqrt{1-\Gamma'^2_{ANT}}\right|, \tag{14}$$

$$|S_{32}| = \left|\frac{2\sqrt{\frac{Z'_{ANT}}{Z_o}}\left(\frac{Z_o - j2Z_{feed,ANT-RX}}{Z_o + 2Z_{feed,ANT-RX}}\right)}{Z'_{ANT}\left[\frac{1}{Z'_{ANT}} + \frac{1}{Z_o} - \frac{1}{Z_{feed,ANT-RX}}\left(\frac{Z_o - j2Z_{feed,ANT-RX}}{Z_o + 2Z_{feed,ANT-RX}}\right)\right]}\right| \tag{15}$$

In the absence of isolation tuning, the transmission loss of the ideal circulator across antenna VSWR can be expressed as $S_{21,notuning}=S_{32,notuning}=|\sqrt{1-\Gamma_{ANT}^2}|$. Due to isolation tuning, the increase in total link loss for small $\Gamma_{ANT}$ is:

$$(S_{21}+S_{32})_{notuning} - (S_{21}+S_{32}) \approx \left|1-\Gamma_{ANT}^{2(1/2)}\right| \tag{16}$$

This is a second-order loss mechanism, although it does not represent dissipative losses but rather it represents loss due to mismatch. Tuning for larger ΓANT implies larger values of the feed capacitors, which results in larger mismatch.

In some embodiments, 4-bit single-ended capacitors, $C_{SE1}$ and $C_{SE2}$ 1706, can be implemented at the ANT port to compensate for any differential bondwire mismatches.

Figure 18:
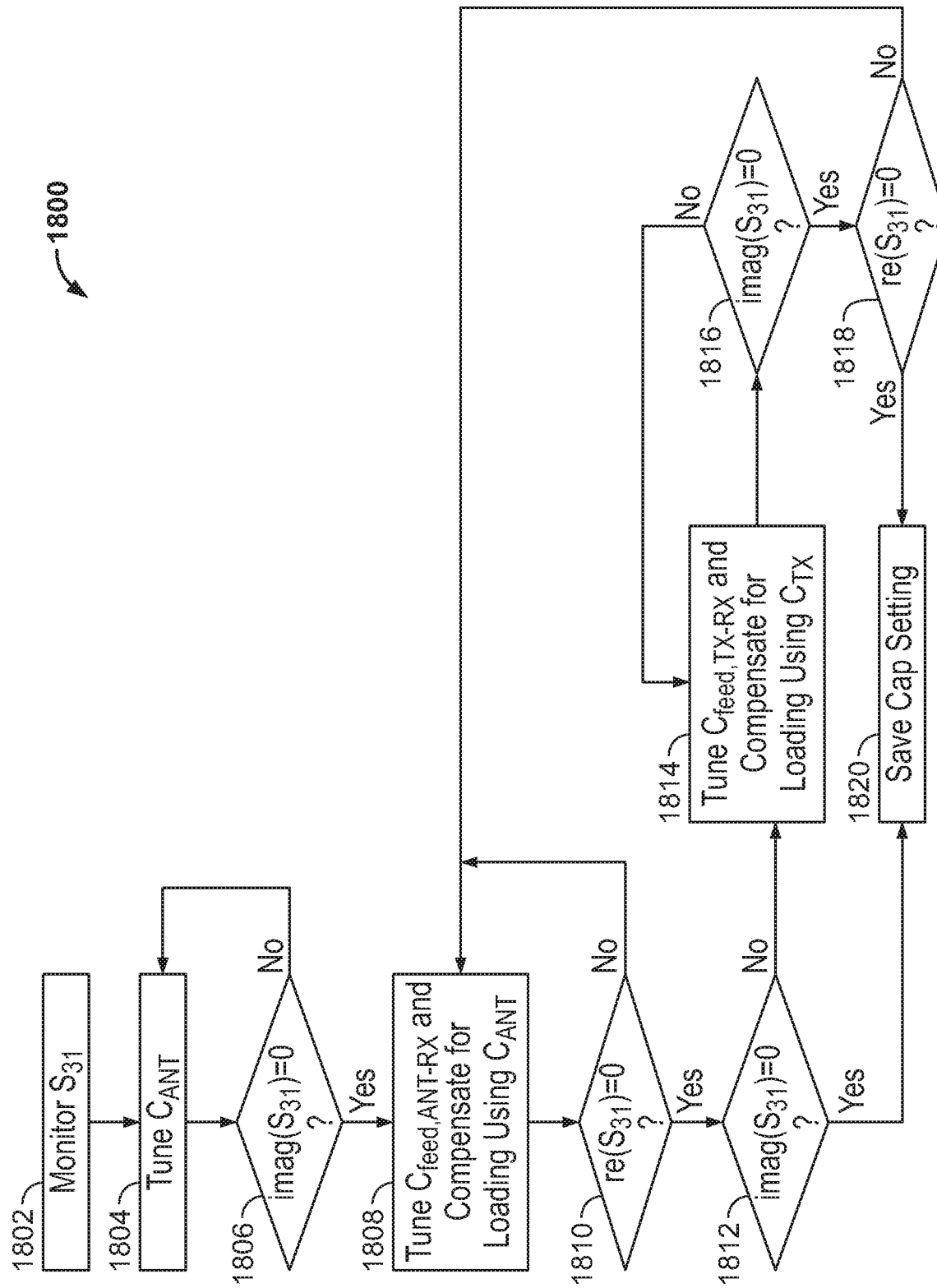
FIG. 18 is an example of process for setting capacitor values in a circulator in accordance with some embodiments.

Turning to FIG. 18, an example 1800 of a process for finding capacitors setting for TX-RX isolation is illustrated.

As shown, after process 1800 begins, the process monitors $S_{31}$ at 1802, tunes $C_{ANT}$ at 1804, and determines whether the imaginary part of $S_{31}$ is zero at 1806. Monitoring of $S_{31}$ can be performed in any suitable manner such as by using a network analyzer in some embodiments. The tuning of $C_{ANT}$ can be performed by controlling which switches in the banks of $C_{ANT}$ are turned on to add any suitable number of capacitors to $C_{ANT}$. Process 1800 can continue to tune $C_{ANT}$ until the imaginary part of $S_{31}$ is zero. Once the imaginary part of $S_{31}$ is zero, the imaginary part of the $\Gamma_{ANT}$ has been compensated.

Next, at 1808 and 1810, process 1800 can tune $C_{feed,ANT-RX}$ and monitor the real part of $S_{31}$ to determine whether it is zero. The tuning of $C_{feed,ANT-RX}$ can be performed by controlling which witches in the banks of $C_{feed,ANT-RX}$ are turned on to add any suitable number of capacitors to $C_{feed,ANT-RX}$. Process 1800 can continue to tune $C_{feed,ANT-RX}$ until the real part of $S_{31}$ is zero. Process 1800 can determine the sign of C feed,ANT-RX based on the sign of the real part of $S_{31}$.

When TX-RX isolation is high, the RX node is equivalent to a ground for TX excitations. Hence, $C_{feed,ANT-RX}$ is equivalent to a capacitor from ANT port to ground. As mentioned above, this loading on the ANT port makes tuning for isolation a 2-D problem. This can be avoided by compensating the loading due to $C_{feed,ANT-RX}$, which is achieved by modifying $C_{ANT}$ with $\Delta C_{ANT}=-0.5\Delta C_{feed,ANT-RX}$.

The tuning of $C_{feed,ANT-RX}$ at 1808 may modify the imaginary part of $S_{31}$ due to non-idealities in the circulator. Thus, at 1812, process can determine whether the imaginary part of $S_{31}$ is zero, and, if not, can branch to 1814 to tune $C_{feed,TX-RX}$ to adjust the imaginary part of $S_{31}$, and compensate for loading by modifying $C_{TX}$ with $\Delta C_{TX}$= $-0.5\Delta C_{feed,TX-RX}$ at. After tuning $C_{feed,TX-RX}$ at 1814, process 1800 can determine whether the imaginary part of $S_{31}$ is zero at 1816, and, if not, loop back to 1814. Otherwise, process 1800 can branch to 1818 to check to make sure the real part of $S_{31}$ is still zero. If not, process 1800 can loop back to 1808.

If process 1800 determines at 1812 that the imaginary part of $S_{31}$ is zero or determines at 1818 that the real part of Saris zero, then, at 1820, process 1800 can save the capacitor settings and end.

Figure 19:
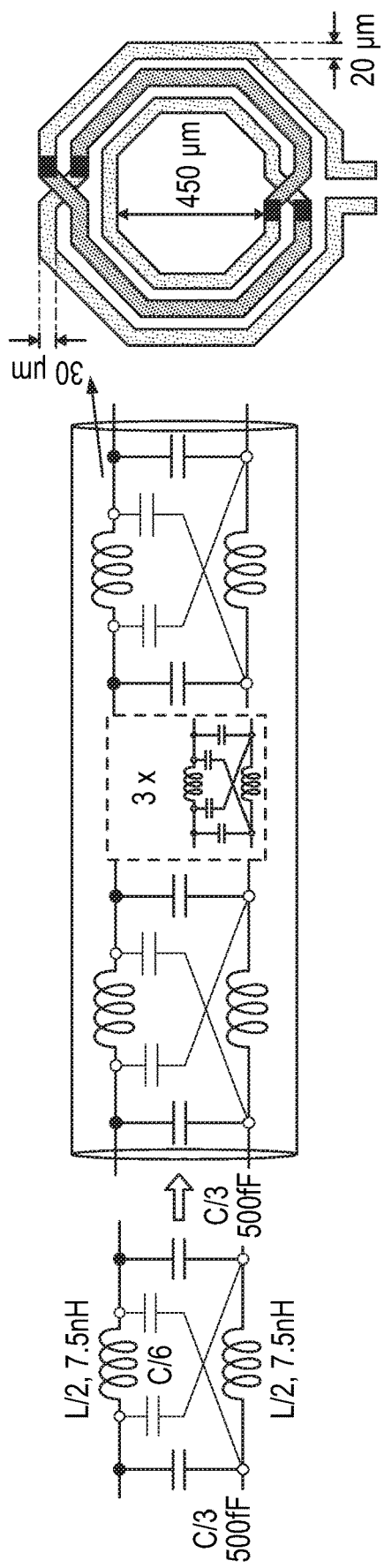
FIG. 19 is an example of CLC section used to implement a transmission line section in a gyrator in accordance with some embodiments.

As shown in FIG. 17, transmission line 1708 in the gyrator can be implemented using an LC ladder configuration in some embodiments. This LC ladder configuration can absorb parasitic capacitances of the switches and miniaturize the transmission line, making an integrated circuit implementation of the circulator feasible with low modulation frequency. The insertion losses of this circulator can be estimated as:

$$S_{21} = \left(\frac{Q_{ind}}{Q_{ind}+2}\right)\left(\frac{Q_{sw}}{Q_{sw}+1}\right)\left(\frac{Q_{filter}}{Q_{filter}+1}\right) \times \left(\frac{Q_{NR_{effec}}}{Q_{NR_{effec}}+1}\right), \quad (17)$$

$$S_{32} = \left(\frac{Q_{ind}}{Q_{ind}+2}\right)\left(\frac{Q_{filter}}{Q_{filter}+1}\right)\left(\frac{Q_{NR_{effec}}}{Q_{NR_{effec}}+1}\right) \quad (18)$$

where $Q_{ind}$ is the quality factor of the inductors in the $3\lambda/4$ ring, $Q_{sw}=Z_O/R_{sw}$ is an effective quality factor associated with switch-ON resistance, $Q_{NReffec} \approx 2(1+k_{Q_{NR}}^2/(1-k_{Q_{NR}}^2)$ ($k_{Q_{NR}}$ represents the transmission loss of the gyrator due to resistive losses in the gyrator transmission line) is the effective quality factor of the transmission line in the gyrator due to its resistive losses, and $Q_{filter}$ is an effective quality factor associated with the Bragg effect of the quasi-distributed transmission line in the gyrator and finite rise/fall time of the modulation signals. In some embodiments, due to the low modulation frequency, the clock path could support seven harmonics, and hence, $Q_{filter}$ is mainly limited by the Bragg effect, making $Q_{filter} \approx Q_{Bragg}$. Using a hybrid-π section, as shown in FIG. 19, can enable a higher Bragg frequency than traditional LC π sections and can improves $Q_{Bragg}$. To further enhance $Q_{Bragg}$, the spiral inductors can use alternate top wide metal layers for the turns to improve self-resonance frequency.

In some embodiments, to improve the linearity and power handling of the passive transistor switches in the gyrator, a DC bias voltage of 0.7 V (or any other suitable value) can be provided to the gates of the transistor switches in some embodiments.

Figure 20:
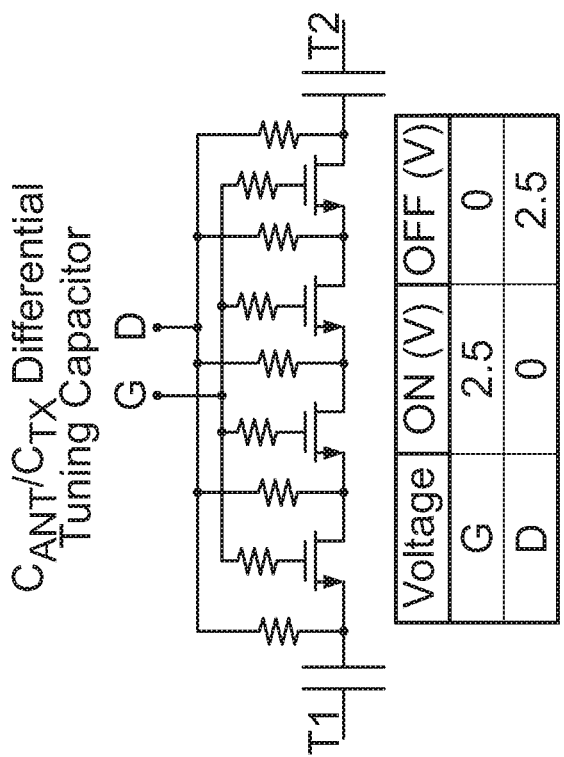
FIG. 20 is an example of a diagram showing schematics and tables for stacked switches, drive signal values, and capacitances in in accordance with some embodiments.

In some embodiments, as shown in FIG. 20, in the programmable capacitor banks, device stacking can be employed in the static switches to ensure that they do not limit linearity and power handling.

In some embodiments, the differential tunable capacitors $C_{TX}$ and $C_{ANT}$ can use 4-stacked switches, and the drains of these switches can be biased to $V_{DD}$ (e.g., 2.5 V) during their OFF state. This can allow the switches to remain in the OFF state and handle an AC swing up to $2 \times V_{DD}$ per switch without violating breakdown conditions in some embodiments. Thus, these differential capacitor banks with 4-stacked switches can handle up to 20 $V_{pp}$, i.e., 33 dBm in some embodiments.

In some embodiments, the differential feed capacitor banks can use two MIM capacitors with four sets of 3-stacked thick-oxide switches, as shown in FIG. 17. The circulator can be biased at 0 V, and the source of the third switch can be directly connected to the RX port and hence, can be biased at 0 V (e.g., $D_4$=0 V) in both ON and OFF states, in some embodiments. Hence, to distribute the voltage stress equally while ensuring high power handling, the drains of the remaining transistors in their OFF state can be biased with linearly increasing DC bias voltages, as shown in FIG. 20 (e.g., $D_1$=2.5 V, $D_2$=1.66 V, and $D_3$=0.83 V), in some embodiments. This can allow the 3-stacked feed capacitor banks to handle up to a differential voltage of 25 $V_{pp}$ in some embodiments.

In some embodiments, to protect the circulator and any connected circuits from electrostatic discharge (ESD), ESD diodes can be placed at the the RX port, where the voltage swing is heavily suppressed for TX-port excitations. Since the RX port is shorted to the ANT and TX ports at DC, these diodes offer ESD protection at the TX and ANT ports as well.

In some embodiments, any suitable values of components can be used in the circulators described herein. For example, in some embodiments, the values of various components can be as described below:

1) The inductors used to for transmission line sections can each have a single-ended inductance of 8 nH or any other suitable value in some embodiments. These inductors can be differentially coupled resulting in a high-quality factor of 22 at 1 GHz with self-resonance frequency at 4.5 GHz in some embodiments.

2) The switches in the doubly balanced switch sets can be implemented using 26×20 μm/0.32 μm thick-oxide floating body transistors in some embodiments. The device-level and layout-extracted ON-resistances of these transistors can be 1.5 and 1.8 ohms, respectively, in some embodiments.

3) The inductors in each of the differential hybrid-π sections of the gyrators can be implemented using two separate spiral inductors of inductance 7.5 nH each as shown in FIG. 19 in some embodiments. These inductors can use alternate top wide (e.g., 20-40 μm (e.g., 30 μm)) or any other suitable value) metal layers for the turns, as shown in FIG. 19, in some embodiments. More particularly, for example, as shown in FIG. 19, alternating series portions of the inductor (turns 1, 2, 3, and 4) can be placed in alternating metal layers of the substrate (e.g., turns 1 and 3 in metal layer 4 and turns 2 and 4 in metal layer 5) in some embodiments.

4) The shunt capacitors at TX and ANT, $C_{TX}$ and $C_{ANT}$, can be implemented using differential 4-stacked switched capacitor banks in some embodiments. $C_{TX}$ and $C_{ANT}$ can be implemented with 6-bit and 8-bit resolution and tuning range of 0.13-0.8 and 0.38-3.14 pF, respectively, in some embodiments. These capacitor banks can be designed for a Q of 40 in some embodiments.

5) The TX-ANT and ANT-RX feed capacitors ($C_{feed,TX-RX}$ and $C_{feed,ANT-RX}$) can be implemented with 7-bit and 6-bit resolution and tuning range of −0.77-0.77 pF and −1.5-1.5 pF, respectively, as shown in FIG. 17, in some embodiments. Here, the negative capacitance implies that the feed capacitors are in a crisscross connection, resulting in a lead phase response. The LSB of these capacitors limits the maximum TX-to-RX isolation achievable and can be 12 fF or any other suitable value in some embodiments. This limits the notch depth to −57 dB in some embodiments.

6) In some embodiment, two 3-stacked single ended switch capacitor banks can be implemented at ANT+ and ANT− to compensate for any differential mismatch between the bondwires.

7) In some embodiments, the clock path can include pseudo-differential buffers to convert an input 666-MHz sinusoid to a square wave, which can then be divided by 2 to generate differential I/Q modulation signals. These modulation signals can be buffered through an inverter chain with a fan-out of 2, and then the mixer switches can be driven by the final buffer with a fan-out of 1.5, in some embodiments.

In some embodiments, due to a differential implementation of the ANT port, a differential antenna has to be used. While a differential antenna can be implemented without any penalty, it must be noted that this would restrict the system to use certain antenna architectures, unlike single-ended electrical-balanced duplexers which are compatible with single-ended antennas. As an alternative, in some embodiments, a differential-to-single-ended balun can be implemented at the antenna port of the circulator.

Although single transmission lines are illustrated herein as having certain delays, such transmission lines can be implemented as two or more transmission lines having the same total delay.

Although the disclosed subject matter has been described and illustrated in the foregoing illustrative implementations, it is understood that the present disclosure has been made only by way of example, and that numerous changes in the details of implementation of the disclosed subject matter can be made without departing from the spirit and scope of the disclosed subject matter, which is limited only by the claims that follow. Features of the disclosed implementations can be combined and rearranged in various ways.

What is claimed is:

1. A circulator, comprising:
   a gyrator having a first side and having a second side connected to a third port;
   a first transmission line section having a first side connected to the first side of the gyrator and a second side connected to a first port;
   a second transmission line section having a first side connected to the first port and having a second side connected to a second port;
   a third transmission line section having a first side connected to the second port and having a second side connected to the third port;
   a first cancellation path that is connected between the first port and the third port and that introduces a current that is 90 degrees out of phase with a first voltage at the first port; and
   a second cancellation path that is connected between the second port and the third port and that introduces a current that is orthogonal to the current introduced by the first cancellation path.

2. The circulator of claim 1, wherein the gyrator includes a transmission line section comprising a spiral inductor with alternating metal layers that are 20-40 µm wide.

3. The circulator of claim 1, wherein the gyrator includes a plurality of switches that have a gate bias of 0.7 V.

4. The circulator of claim 1, further comprising a plurality of electrostatic discharge diodes connected to the third port.

5. The circulator of claim 1, further comprising a first variable capacitance connected to the first port.

6. The circulator of claim 5, wherein the first variable capacitance includes a first capacitor in series with a first plurality of stacked switches.

7. The circulator of claim 6, wherein a gate of each of the first plurality of stacked switches is coupled to 2.5 V when the switch is ON and the gate of each of the first plurality of stacked switches is connected to 0 V when the switch is OFF.

8. The circulator of claim 7, wherein a drain of each of the first plurality of stacked switches is coupled to 0 V when the switch is ON and the drain of each of the first plurality of stacked switches is connected to 2.5 V when the switch is OFF.

9. The circulator of claim 5, further comprising a second variable capacitance connected to the second port.

10. The circulator of claim 9, wherein the second variable capacitance includes a second capacitor in series with a second plurality of stacked switches.

11. The circulator of claim 10, wherein a gate of each of the second plurality of stacked switches is coupled to 2.5 V when the switch is ON and the gate of each of the second plurality of stacked switches is connected to 0 V when the switch is OFF.

12. The circulator of claim 11, wherein a drain of each of the second plurality of stacked switches is coupled to 0 V when the switch is ON and the drain of each of the second plurality of stacked switches is connected to 2.5 V when the switch is OFF.

13. The circulator of claim 1, wherein the first cancellation path includes a third capacitor in series with each of a third plurality of stacked switches and a fourth plurality of stacked switches.

14. The circulator of claim 13, wherein a gate of each of the third plurality of stacked switches is coupled to 2.5 V when the switch is ON and the gate of each of the third plurality of stacked switches is connected to 0 V when the switch is OFF.

15. The circulator of claim 14, wherein a gate of each of the fourth plurality of stacked switches is coupled to 2.5 V when the switch is ON and the gate of each of the fourth plurality of stacked switches is connected to 0 V when the switch is OFF, wherein the third plurality of stacked switches are OFF when the fourth plurality of switches are ON, and wherein the third plurality of stacked switches are ON when the fourth plurality of switches are OFF.

16. The circulator of claim 14, wherein a drain of each of the third plurality of stacked switches is coupled to 0 V when the switch is ON, wherein a drain of a first switch of the third plurality of stacked switches is coupled to 2.5 V when the first switch is OFF, wherein a drain of a second switch of the third plurality of stacked switches is coupled to 1.66 V when the second switch is OFF, wherein a drain of a third switch of the third plurality of stacked switches is coupled to 0.83 V when the third switch is OFF, and wherein a drain of a fourth switch of the third plurality of stacked switches is coupled to 0 V when the fourth switch is OFF.

* * * * *